US012589372B2

(12) United States Patent
Nisisako

(10) Patent No.: US 12,589,372 B2
(45) Date of Patent: Mar. 31, 2026

(54) MICRODROPLET/BUBBLE GENERATION DEVICE

(71) Applicant: Japan Science and Technology Agency, Kawaguchi (JP)

(72) Inventor: Takasi Nisisako, Tokyo (JP)

(73) Assignee: Japan Science and Technology Agency, Saitama (JP)

( * ) Notice: Subject to any disclaimer, the term of this patent is extended or adjusted under 35 U.S.C. 154(b) by 871 days.

(21) Appl. No.: 17/911,096

(22) PCT Filed: Mar. 12, 2021

(86) PCT No.: PCT/JP2021/010205
§ 371 (c)(1),
(2) Date: Sep. 12, 2022

(87) PCT Pub. No.: WO2021/182632
PCT Pub. Date: Sep. 16, 2021

(65) Prior Publication Data
US 2023/0142172 A1     May 11, 2023

(30) Foreign Application Priority Data

Mar. 13, 2020    (JP) ................................ 2020-044633

(51) Int. Cl.
*B01F 33/3012*          (2022.01)
*B01F 23/232*          (2022.01)
(Continued)

(52) U.S. Cl.
CPC ...... *B01F 33/3012* (2022.01); *B01F 23/2323* (2022.01); *B01F 23/4143* (2022.01);
(Continued)

(58) Field of Classification Search
None
See application file for complete search history.

(56) References Cited

U.S. PATENT DOCUMENTS 10,357,771 B2 *  7/2019  Bharadwaj .......... B01L 3/50273
10,906,040 B2 *  2/2021  Perkins .................. G01N 21/62
(Continued)

FOREIGN PATENT DOCUMENTS

CN          106140340 A     11/2016
JP        2004-243308 A      9/2004
(Continued)

OTHER PUBLICATIONS

Nishisako et al., JP 2019-150748, English translation provided. 2019. (Year: 2019).*

(Continued)

*Primary Examiner* — Lore R Jarrett
(74) *Attorney, Agent, or Firm* — Foley & Lardner LLP

(57) ABSTRACT

A microdroplet/bubble-generating device comprising a slit and a row of a plurality of microflow paths is constructed, in such a manner that either a continuous phase or dispersion phase is supplied to the slit, and so that the end of the slit, the other supply port for the continuous phase or dispersion phase and the liquid recovery port are connected. The plurality of microflow paths each have a narrow part where the cross-sectional area of the flow channel is locally narrowed adjacent to or near the connection point between the slit and the microflow path. The continuous phase and dispersion phase that have met at the connection points flow into the narrow parts, and the dispersion phase is sheared at the narrow parts with the continuous phase flow as the driving force, forming droplets or gas bubbles of the dispersion phase. The product is recovered from the liquid recovery port.

18 Claims, 14 Drawing Sheets

(a)

(b)

(c)

(d)

(51) Int. Cl.

| | | |
|---|---|---|
| *B01F 23/41* | (2022.01) | |
| *B01F 25/314* | (2022.01) | |
| *B01F 33/30* | (2022.01) | |
| *B01F 33/3011* | (2022.01) | |
| *B01F 35/00* | (2022.01) | |
| *B81B 1/00* | (2006.01) | |

(52) U.S. Cl.
CPC .... *B01F 25/31432* (2022.01); *B01F 33/3011* (2022.01); *B01F 33/30351* (2022.01); *B01F 35/561* (2022.01); *B81B 1/006* (2013.01); *B01F 2215/0431* (2013.01); *B81B 2201/057* (2013.01); *B81B 2203/0338* (2013.01)

(56) References Cited

U.S. PATENT DOCUMENTS

| | | | |
|---|---|---|---|
| 2004/0022690 A1 | 2/2004 | Kawai et al. | |
| 2007/0196397 A1* | 8/2007 | Torii ..................... | B01F 25/314 604/500 |
| 2021/0001340 A1 | 1/2021 | Nisisako et al. | |

FOREIGN PATENT DOCUMENTS

| | | |
|---|---|---|
| JP | 2005-144356 A | 6/2005 |
| WO | WO-2019/168130 A1 | 9/2019 |

OTHER PUBLICATIONS

Anna et al., "Formation of dispersions using "flow focusing" in microchannels," Appl. Phys. Lett., Jan. 20, 2003, 82:364-366.

Conchouso et al., "Three-dimensional parallelization of microfluidic droplet generators for a litre per hour volume production of single emulsions," Lab Chip, 2014, 14:3011-3020.

Jeong et al., "Kilo-scale droplet generation in three-dimensional monolithic elastomer device (3D Med)," Lab Chip, 2015, 15:4387-4392.

Jeong et al., "Liter-scale production of uniform gas bubbles via parallelization of flow-focusing generators," Lab Chip, 2017, 17:2667-2673.

Jeong et al., "Recent developments in scale-up of microfluidic emulsion generation via parallelization," Korean J. Chem. Eng., 2016, 33:1757-1766.

Li et al., "Multiple modular microfluidic (M3) reactors for the synthesis of polymer particles," Lab Chip, 2009, 9:2715-2721.

Meris et al., "Novel Parallel Integration of Microfluidic Device Network for Emulsion Formation," Ind. Eng. Chem., 2009, 48:8881-8889.

Nisisako et al., "High-volume production of single and compound emulsions in a microfluidic parallelization arrangement coupled with coaxial annular world-to-chip interfaces," Lab Chip, 2012, 12:3426-3435.

Nisisako et al., "Microfluidic large-scale integration on a chip for mass production of monodisperse droplets and particles," Lab Chip, 2008, 8:287-293.

Nisisako et al., "Recent advances in microfluidic production of Janus droplets and particles," Curr. Opin. Colloid Interface Sci., 2016, 25:1-12.

Romanowsky et al., "High throughput production of single core double emulsions in a parallelized microfluidic device," Lab Chip, 2012, 12:802-807.

* cited by examiner (c)

(d)

(e)

(f)

(c)

(d)

(a)

(b)

(c)

(d)

(a)

(b)

(b)

(c)

$D_{avg}$ = 115 μm
CV = 4.2 %
($n$ = 186)

(a)

MICRODROPLET/BUBBLE GENERATION DEVICE

CROSS-REFERENCE TO RELATED APPLICATIONS

This application is the U.S. National Stage of PCT/JP2021/010205, filed Mar. 12, 2021, which claims priority to JP 2020-044633, filed Mar. 13, 2020.

FIELD

The present invention relates to a microdroplet/gas bubble-generating device using microflow paths.

BACKGROUND

Methods for generating microdroplets and gas bubbles using the branched structures of microflow paths allow formation of emulsion droplets and gas bubbles with excellent monodisperse properties, and they are therefore employed in a variety of fields, including chemical/biochemical analysis. When such a method is employed as a production technique, however, it is difficult to achieve required production volumes of several tons per year, for example, using a single microflow path (NPLs 1 and 2).

Such being the case, it has been attempted to provide multiple microflow paths in parallel to achieve a drastic increase in production volume of droplets or gas bubbles (scaling-up) (NPLs 3 and 4). When generating microdroplets and gas bubbles using branched structures of microflow paths, the droplets or gas bubbles generated vary in size depending on the flow rates of the dispersion phase and continuous phase, and therefore formation of droplets or gas bubbles of homogeneous size requires an evenly distributed supply of the dispersion phase and continuous phase in the parallel microflow paths. In a conventional paralleled device, equal flow distributions are formed in different generating flow channels by a construction in which symmetrically branched distributed flow channels are connected for each generating flow channel (NPLs 3 to 5), or a construction in which flow channels that are sufficiently large for the sizes of the generating flow channels are connected in a ladder-like fashion (NPLs 5 to 7). As reported in the past, distributed flow channels with a symmetrically branched structure have been used to form a maximum of 512 cross-shaped droplet-generating flow channels paralleled in an annular fashion (NPL 8), and ladder-like liquid distributed flow channels have been used to form a maximum of 1000 droplet-generating flow channels paralleled in a matrix fashion (NPL 9). Mass production of gas bubbles using a similar apparatus has also been reported (NPL 10). There have also been proposed devices with removable liquid supply flow channels and droplet-generating flow channels (NPLs 2 and 3).

However, the conventional paralleled devices require complex device fabrication steps in order to create separate through-holes corresponding to liquid droplet/gas bubble-generating flow channels, for connection between the liquid- or gas-distributing flow channels and the liquid droplet/gas bubble-generating flow channels.

PTL 1 proposes a microdroplet/bubble-generating device wherein droplet/gas bubble-generating flow channels are not set in the two-dimensional plane, but rather a simple construction comprising a three-dimensional combination of slits and a microflow channel array is used to eliminate the need for separated through-holes corresponding to liquid droplet/gas bubble-generating flow channels. The device is a microdroplet/bubble-generating device that can be easily installed and managed with a dense arrangement of microdroplet- or gas bubble-forming units. This device, however, simply uses small flow channels when forming small-sized droplets/gas bubbles, and has been problematic in terms of risks from high pressure loss and a higher degree of clogging.

Conventional microflow path techniques related to the present invention that are widely used include techniques that form droplets or gas bubbles by arranging continuous phase supply channels on both sides of a dispersion phase supply channel on a panel, surrounding the dispersion phase flow with the continuous phase flows and supplying them both to a locally narrowed part of the flow channel (flow focusing) (NPL 11). However, since two continuous phase supply channels are arranged on both sides of a single dispersion phase supply channel in this technique, it has not been suitable for high density channeling.

CITATION LIST

Non Patent Literature

[NPL 1] T. Nisisako et al., Lab Chip, 8, 287-293, 2008.
[NPL 2] T. Nisisako et al., Lab Chip, 12, 3426-3435, 2012.
[NPL 3] T. Nisisako et al., Curr. Opin. Colloid Interface Sci., 25, 1-12, 2016.
[NPL 4] H.-H. Jeong et al., Korean J. Chem. Eng. 33, 1757-1766, 2016.
[NPL 5] G. T. Meris et al., Ind. Eng. Chem. 48, 881-889, 2009.
[NPL 6] W. Li et al., Lab Chip, 9, 2715-2721, 2009.
[NPL 7] M. B. Romanowsky et al., Lab Chip, 12, 802-807, 2012.
[NPL 8] D. Conchouso et al., Lab Chip, 14, 3011-3020, 2014.
[NPL 9] H.-H. Jeong et al., Lab Chip, 15, 4387-4392, 2015.
[NPL 10] H.-H. Jeong et al., Lab Chip, 17, 2667-2673, 2017.
[NPL 11] S. L. Anna et al., Appl. Phys. Lett., 82, 364-366, 2003.

PATENT LITERATURE

[PTL 1] WO2019/168130

SUMMARY

Technical Problem

It is an object of the present invention to solve the problem described above and to provide a microdroplet/bubble-generating device having a device construction with a three-dimensional combination of slits and microflow channel arrays, wherein droplets and gas bubbles of smaller sizes can be formed, and microdroplets or gas bubbles can be formed with lower pressure loss and lower risk of clogging.

Solution to Problem

In order to achieve this object, the invention provides the following inventions and aspects.
(Aspect 1)
A microdroplet/bubble-generating device (100), the microdroplet/bubble-generating device (100) comprising a row of a plurality of microflow paths (9) and a slit (3, 4), and having a construction wherein:

the plurality of microflow paths (9) are connected with the end of the slit (3, 4) in a reference plane (S) and the slit (3, 4) extends from the reference plane (S) in a manner receding from the plurality of microflow paths (9) in the transverse direction of the plurality of microflow paths (9), the plurality of microflow paths (9) each have a first side microflow path (9-1) and a second side microflow path (9-2) on either side of a connection point (P) between each of the plurality of microflow paths (9) and the slit (3, 4), the first side microflow paths (9-1) are connected with one of the continuous phase supply port (7) and the dispersion phase supply port (6) and the slit (3, 4) is connected with the other one of the continuous phase supply port (7) and dispersion phase supply port (6), a continuous phase (2) being supplied through the continuous phase supply port (7) and a dispersion phase (1) being supplied through the dispersion phase supply port (6), the second side microflow paths (9-2) are connected with a liquid recovery port (8), the plurality of microflow paths (9) each have a narrow part (N) in the second side microflow path (9-2) where the cross-sectional area of the flow channel is locally narrowed, either in contact with or near each connection point (P) between each of the plurality of microflow paths (9) and the slit (3, 4), and the continuous phase (2) and dispersion phase (1) that have met at each connection point (P) between the plurality of microflow paths (9) and slit (3, 4) flow into each narrow part (N), the dispersion phase (1) being sheared at the narrow part (N) with flow of the continuous phase (2) as the driving force, forming droplets or gas bubbles of the dispersion phase (1), and the product being collected through the liquid recovery port (8).

(Aspect 2)

The microdroplet/bubble-generating device according to aspect 1, wherein the cross-sectional area of the narrow part (N) is in the range of $\frac{1}{100}$ to 1/1.5 of the area of the cross-section of the second side microflow path (9-2).

(Aspect 3)

The microdroplet/bubble-generating device according to aspect 1 or 2, wherein the length of the narrow part (N) in the flow channel direction is in the range of 0.01 to 10 times the square root of the area of the cross-section of the second side microflow path (9-2).

(Aspect 4)

The microdroplet/bubble-generating device according to any one of aspects 1 to 3, wherein the distance from the connection point (P) between each of the plurality of microflow paths (9) and the slit (3, 4) to the narrow part (N) is no greater than 5 times the square root of the area of the cross-section of the second side microflow path (9-2) (including zero), with the proviso that when the plurality of microflow paths (9) and the slit (3, 4) are each separated on either side of the reference plane (S), the narrow part (N) may be overlapping with the connection point (P) in the plan view of the reference plane (S).

(Aspect 5)

The microdroplet/bubble-generating device according to any one of aspects 1 to 4, wherein the microflow paths (9) have a width of 0.1 to 1000 μm in the plan view of the reference plane (S), and a height of 0.1 to 1000 μm in the direction perpendicular to the reference plane (S).

(Aspect 6)

The microdroplet/bubble-generating device according to any one of aspects 1 to 5, wherein the width of the slit (3, 4) at the end is 1 to 1000 μm in the plan view of the reference plane (S).

(Aspect 7)

The microdroplet/bubble-generating device according to any one of aspects 1 to 6, wherein the cross-sectional dimension of the narrow part (N) is in the range of 0.1 to 1000 μm.

(Aspect 8)

The microdroplet/bubble-generating device according to any one of aspects 1 to 7, wherein the length of the narrow part (N) in the flow channel direction is in the range of 0.1 to 1000 μm.

(Aspect 9)

The microdroplet/bubble-generating device according to any one of aspects 1 to 8, wherein the distance from the connection point (P) between each of the plurality of microflow paths (9) and the slit (3, 4) to the narrow part (N) is 1000 μm or smaller (including zero), with the proviso that when the plurality of microflow paths (9) and slit (3, 4) are each separated on either side of the reference plane (S), the narrow part (N) may be overlapping with the connection point (P) in the plan view of the reference plane (S).

(Aspect 10)

The microdroplet/bubble-generating device according to any one of aspects 1 to 9, wherein the continuous phase supply port (7) or dispersion phase supply port (6) of the first side microflow path (9-1), and/or the liquid recovery port (8), include an additional slit(s) (3, 4, 5), the additional slit(s) (3, 4, 5) having their end(s) connected with the plurality of microflow paths (9), and extending in a manner receding from the plurality of microflow paths (9) in the transverse direction of the plurality of microflow paths (9).

(Aspect 11)

The microdroplet/bubble-generating device according to any one of aspects 1 to 10, wherein the liquid recovery port (8) comprises a cylindrical hole (5-1), and the second side microflow paths (9-2) of the plurality of microflow paths (9) are connected with the cylindrical hole (5-1).

(Aspect 12)

The microdroplet/bubble-generating device according to any one of aspects 1 to 11, wherein the dispersion phase (1) is a gas phase and the continuous phase (2) is a liquid phase.

(Aspect 13)

The microdroplet/bubble-generating device according to any one of aspects 1 to 11, wherein the dispersion phase (1) and the continuous phase (2) are both liquid phases.

(Aspect 14)

The microdroplet/bubble-generating device according to any one of aspects 1 to 11, wherein the inner walls of the plurality of microflow paths (9) are composed of hydrophobic surfaces, the dispersion phase (1) is an aqueous phase, and the continuous phase (2) is an organic phase.

(Aspect 15)

The microdroplet/bubble-generating device according to any one of aspects 1 to 11, wherein the inner walls of the plurality of microflow paths (9) are composed of hydrophilic surfaces, the dispersion phase (1) is an organic phase, and the continuous phase (2) is an aqueous phase.

Advantageous Effects of Invention

According to the invention there is provided a microdroplet/bubble-generating device (100) that can be easily installed and managed with a dense arrangement of microdroplet- or gas bubble-forming units, and wherein droplets and gas bubbles of smaller sizes can be formed and microdroplets or gas bubbles can be formed with lower pressure loss and lower risk of clogging. According to the invention it is also possible to obtain droplets of a desired size with a given dispersion phase flow rate and a lower continuous phase flow rate, and for an effect of realizing a higher dispersion phase volume ratio while reducing continuous phase consumption and forming higher-density droplet rows.

BRIEF DESCRIPTION OF DRAWINGS

FIG. 2-1 shows an example of droplet/gas bubble-generating flow channels according to embodiment 1 of the microdroplet/bubble-generating device (100) of the invention. FIG. 2-1(*a*) is a top view of a part with fine grooves, and (b) is an expanded perspective view of the liquid-distributing part.

FIG. 2-2 shows an example of droplet/gas bubble-generating flow channels according to embodiment 1 of the microdroplet/bubble-generating device (100) of the invention. FIG. 2-2(*c*) is a perspective view showing the part with fine grooves and the liquid-distributing part that joins with it (partial cross-section), and (d) is a top view of the part with fine grooves joined with the liquid-distributing part.

FIG. 2-3 shows an example of droplet/gas bubble-generating flow channels according to embodiment 1 of the microdroplet/bubble-generating device (100) of the invention. FIG. 2-3(*e*) and (f) are perspective plan views of the state of droplet formation at the intersection between the slit and microflow paths.

FIG. 3-1 shows embodiment 2 of the microdroplet/bubble-generating device (100) of the invention, where (a) is a perspective view showing the part with fine grooves and the liquid-distributing part that joins with it (partial cross-section), and (b) is a top view where the part with fine grooves and the liquid-distributing part are joined.

FIG. 3-2 shows embodiment 2 of the microdroplet/bubble-generating device (100) of the invention, where (c) and (d) are perspective plan views of the state of droplet formation at the intersection between the slit and microflow paths.

FIG. 6-1 shows embodiment 5 of the microdroplet/bubble-generating device (100) of the invention, where (a) is a perspective view showing the part with fine grooves and a part for annular liquid-distribution after assembly of three members (partial cross-section), and (b) is a top view where the part with fine grooves and the liquid-distributing part are joined.

FIG. 6-2 shows embodiment 5 of the microdroplet/bubble-generating device (100) of the invention, where (c)

and (d) are diagrams showing the state of droplet formation at the intersection between the slit and microflow paths.

Figure 7:
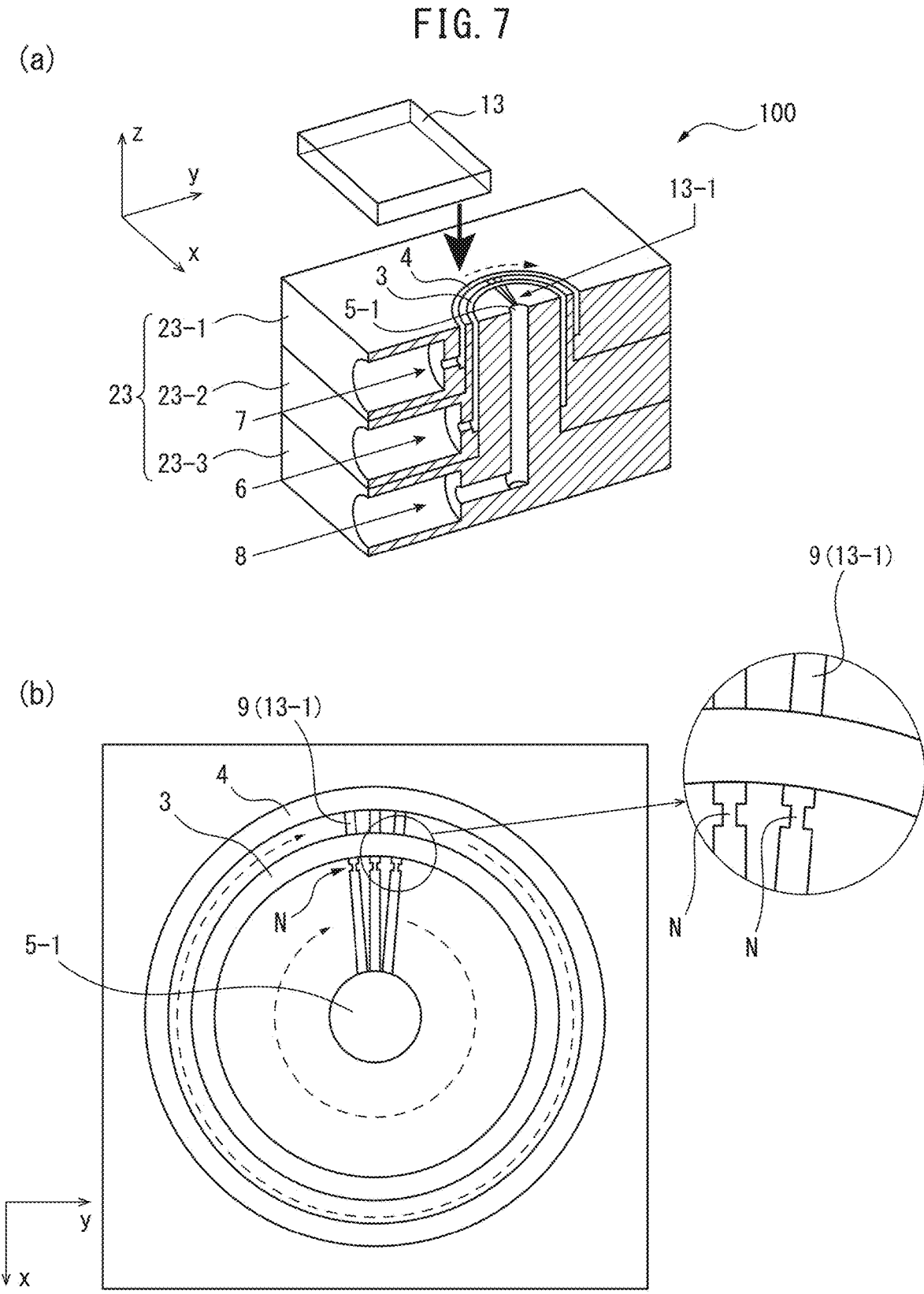

FIG. 7 shows embodiment 7 of the microdroplet/bubble-generating device (100) of the invention, where (a) is a perspective view showing the cover and a part for annular liquid-distribution modified with the fine grooves after assembly of three members (partial cross-section), and (b) is a top view where the cover is joined with the liquid-distributing part modified with the fine grooves.

Figure 8:
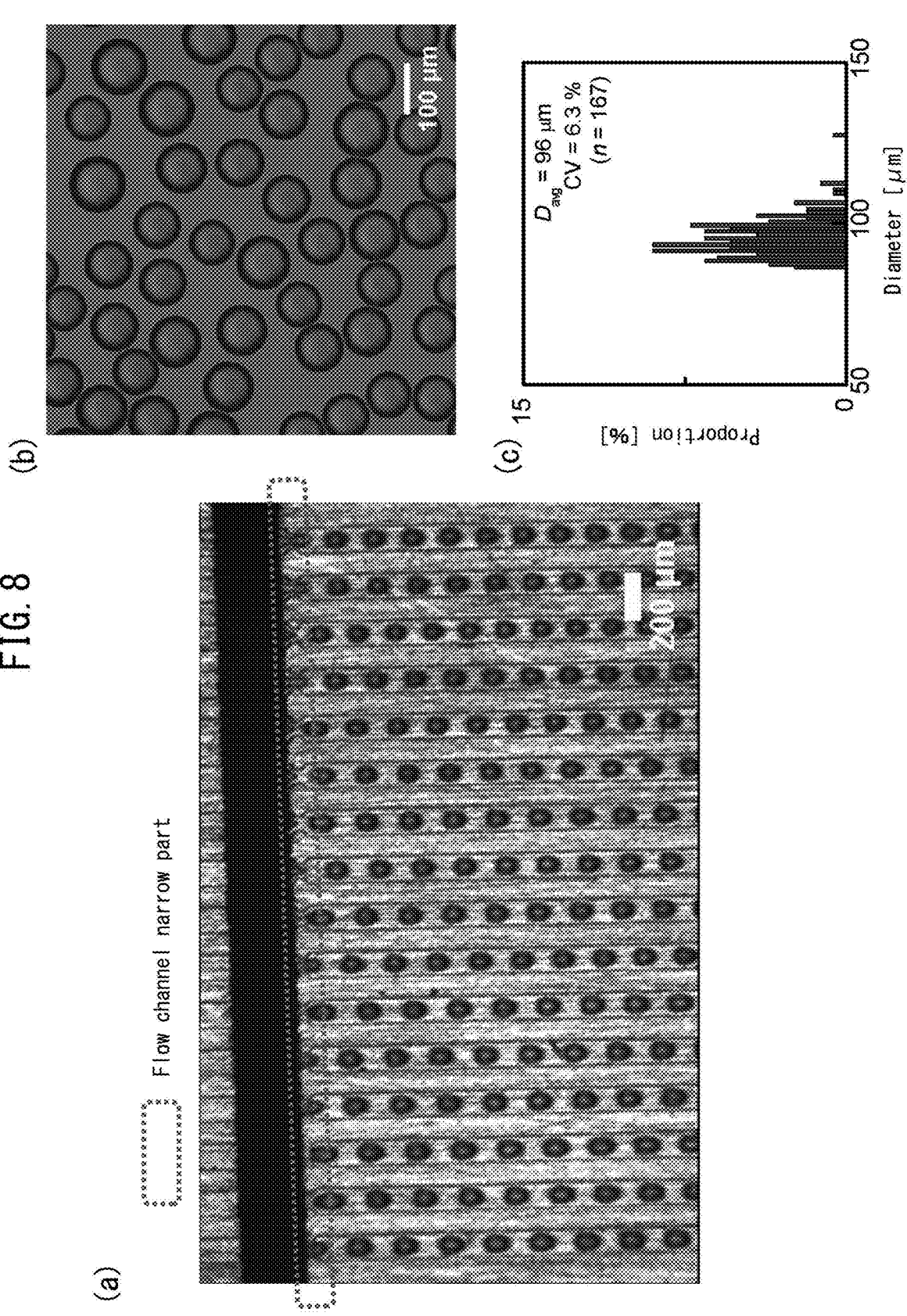

FIG. 8 shows (a) the state of droplet generation and (b), (c) the size distribution of the generated droplets for Example 1 (continuous phase flow rate ($Q_c$)=20 mL/h, dispersion phase flow rate ($Q_d$)=10 mL/h).

Figure 9:
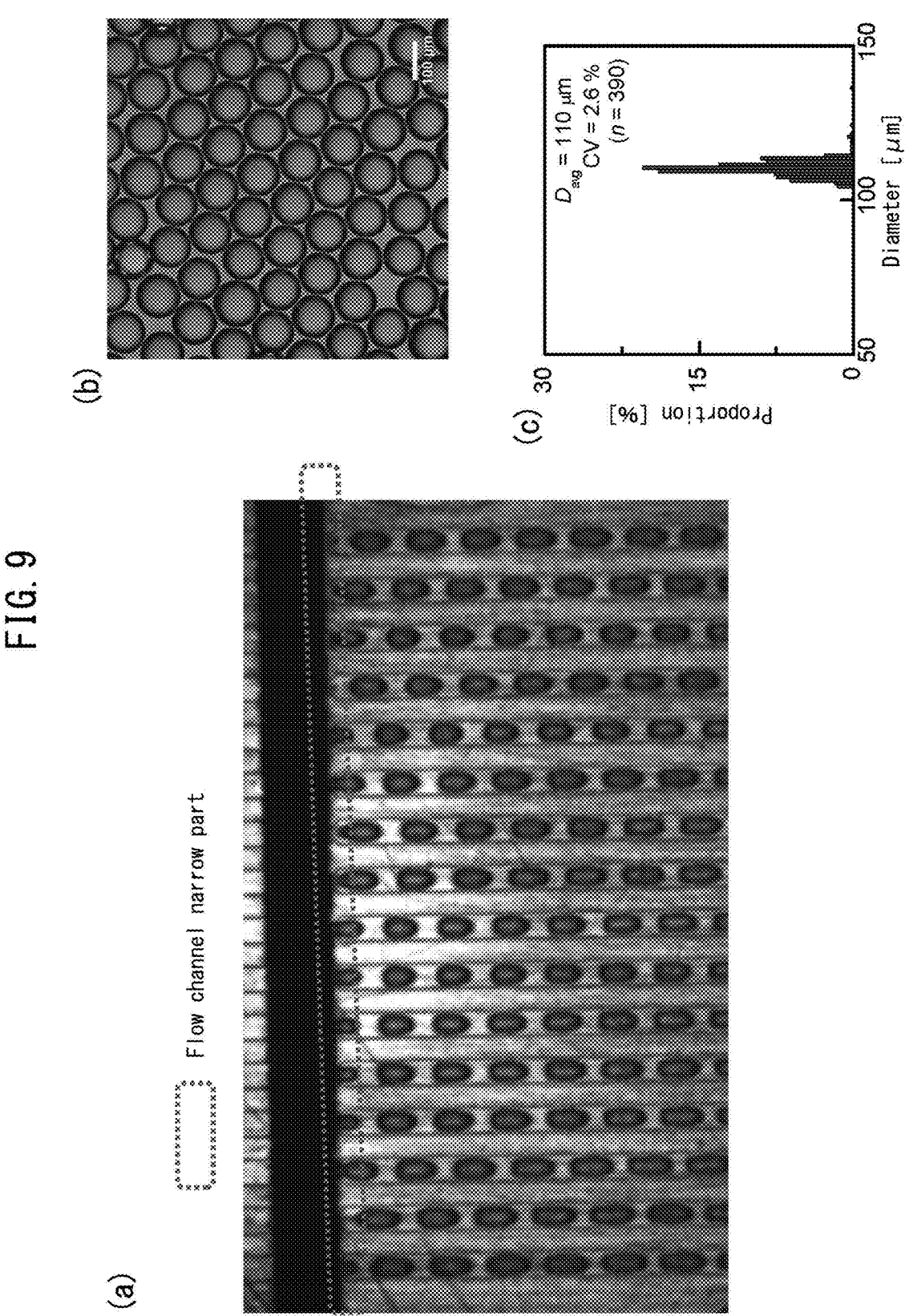

FIG. 9 shows (a) the state of droplet generation and (b), (c) the size distribution of the generated droplets for Example 2 (continuous phase flow rate ($Q_c$)=10 mL/h, dispersion phase flow rate ($Q_d$)=10 mL/h).

Figure 10:
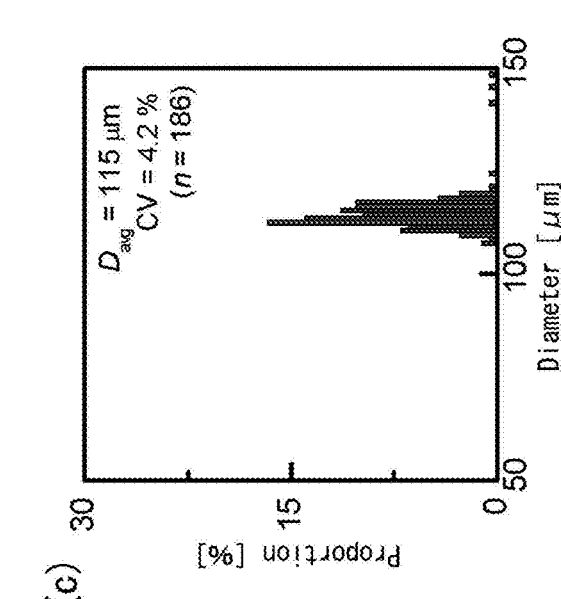
Figure 10:
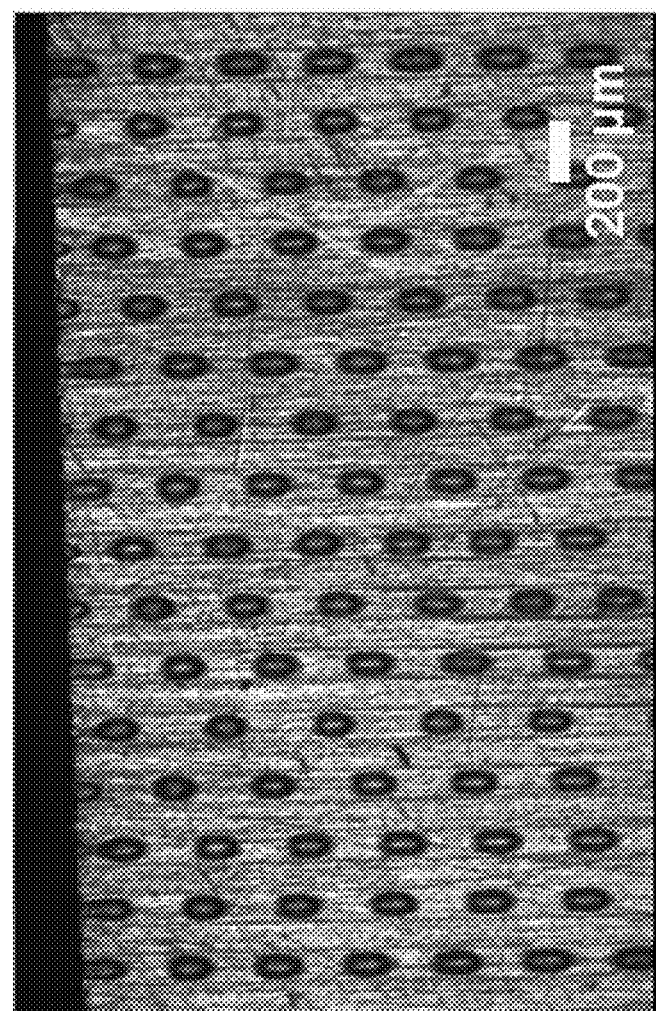

FIG. 10 shows (a) the state of droplet generation and (b), (c) the size distribution of the generated droplets for Comparative Example 1 (continuous phase flow rate ($Q_c$)=20 mL/h, dispersion phase flow rate ($Q_d$)=10 mL/h).

DESCRIPTION OF EMBODIMENTS

The invention relates to a microdroplet/gas bubble-generating device (100), the microdroplet/gas bubble-generating device (100) comprising a row of a plurality of microflow paths (9) and a slit (3, 4), and having a construction wherein:

the plurality of microflow paths (9) are connected with the end of the slit (3, 4) in a reference plane (S) and the slit (3, 4) extends from the reference plane (S) in a manner receding from the plurality of microflow paths (9) in the transverse direction of the plurality of microflow paths (9), the plurality of microflow paths (9) each have a first side microflow path (9-1) and a second side microflow path (9-2) on either side of a connection point (P) between each of the plurality of microflow paths (9) and the slit (3, 4), the first side microflow paths (9-1) are connected with one of the continuous phase supply port (7) and the dispersion phase supply port (6) and the slit (3, 4) is connected with the other one of the continuous phase supply port (7) and dispersion phase supply port (6), a continuous phase (2) being supplied through the continuous phase supply port (7) and a dispersion phase (1) being supplied through the dispersion phase supply port (6), the second side microflow paths (9-2) are connected with a liquid recovery port (8), the plurality of microflow paths (9) each have a narrow part (N) in the second side microflow path (9-2) where the cross-sectional area of the flow channel is locally narrowed, either in contact with or near each connection point (P) between each of the plurality of microflow paths (9) and the slit (3, 4), and the continuous phase (2) and dispersion phase (1) that have met at each connection point (P) between the plurality of microflow paths (9) and slit (3, 4) flow into each narrow part (N), the dispersion phase (1) being sheared at the narrow part (N) with flow of the continuous phase (2) as the driving force, forming droplets or gas bubbles of the dispersion phase (1), and the product being collected through the liquid recovery port (8).

According to the invention, "microdroplet/(gas)bubble-generating device" means a "microdroplet- or (gas) bubble-generating device". It may also be a device that generates either or both microdroplets and micro(gas)bubbles.

The microdroplet/bubble-generating device (100) of the invention comprises a row of a plurality of microflow paths (9), and a slit (3, 4).

The plurality of microflow paths (9) lie on a reference plane (S). The plurality of microflow paths (9) lie, in particular on the above side of the reference plane (S). The plurality of microflow paths (9) are fine flow channels through which a continuous phase (2), dispersion phase (1) or microdroplet/gas bubble-product phase flow. The reference plane (S) may be the surface of an actual part, but the reference plane (S) does not need to be the surface of an actual part, and for the definition of the invention it may instead be a virtual flat plane.

According to the invention, the cross-sectional shapes of the microflow paths (9) may be selected from among rectangular, trapezoid, triangular, polygonal, half-circular, circular, elliptical and half-elliptical shapes, depending on the materials to be worked and the working means. Regarding the sizes of the microflow paths (9), the widths of the flow channels in the plan view of the row of the plurality of microflow paths (9) are in the range of 0.1 to 1000 μm, preferably 1 to 200 μm and more preferably 10 to 100 μm, and the heights of the flow channels in a cross-section perpendicular to the reference plane (S) of the row of the plurality of microflow paths (9) are in the range of 0.1 to 1000 μm, preferably 1 to 200 μm and more preferably 10 to 100 μm. Operation in the prescribed range is possible by flow control, allowing formation of droplets or gas bubbles of sizes corresponding to the dimensions of the microflow paths (9). If the dimensions of the microflow paths (9) are smaller than the prescribed size, it is preferable since the number of microflow paths (9) in the device can be increased and the droplet/gas bubble productivity can be improved. If the dimensions of the microflow paths (9) are greater than the prescribed size it is also preferable since flow pressure loss can be reduced. If the dimensions of the microflow paths (9) are too small, clogging will be more likely to occur and pressure loss will increase, making it more difficult to carry out flexible flow control, while if the dimensions of the microflow paths (9) are too large, flow in the flow channel will be disturbed more easily, making it more difficult to evenly supply the dispersion phase or continuous phase to the plurality of microflow paths and potentially impairing the monodisperse property of the generated droplets, and therefore the dimensions of the microflow paths (9) are preferably in the range of 0.1 to 1000 μm.

The plurality of microflow paths (9) are connected with the end of the slit (3, 4) in the reference plane (S), the slit (3, 4) extending from the reference plane (S) in a manner receding from the plurality of microflow paths (9) in the transverse direction of the plurality of microflow paths (9).

The slit (3, 4) has linear slit end face with a width and an axis line (slit length) having a larger dimension than the width in the reference plane (S), the reference plane (S) being a plane on one side of which, particularly on which the row of the plurality of microflow paths (9) are arranged, and the slit (3, 4) extending from the reference plane (S) with the reference plane (S) as the end, toward the other side in the transverse direction of the reference plane (S), particularly downward (the slit of the invention being a three-dimensional slit having a slit-shaped end face in the reference plane (S) and having a slit-shaped cross-section that continues in the direction crossing the reference plane (S)). The shape of the slit end face is not particularly restricted, and may be straight linear-like or annular-like, for example. The dimension of the slit (3, 4) in the transverse direction of the reference plane (S) may be considered to be the depth (height) of the slit (3, 4).

The row of the plurality of microflow paths (9) is arranged on one side of the reference plane (S), particularly the top side, the row of the plurality of microflow paths (9) being connected at the reference plane (S) with the slit (3, 4) whose end is the reference plane (S). In other words, the plurality of microflow paths (9) have connection points (P) between the plurality of microflow paths (9) and the slit (3, 4) in the reference plane (S).

Figure 1:
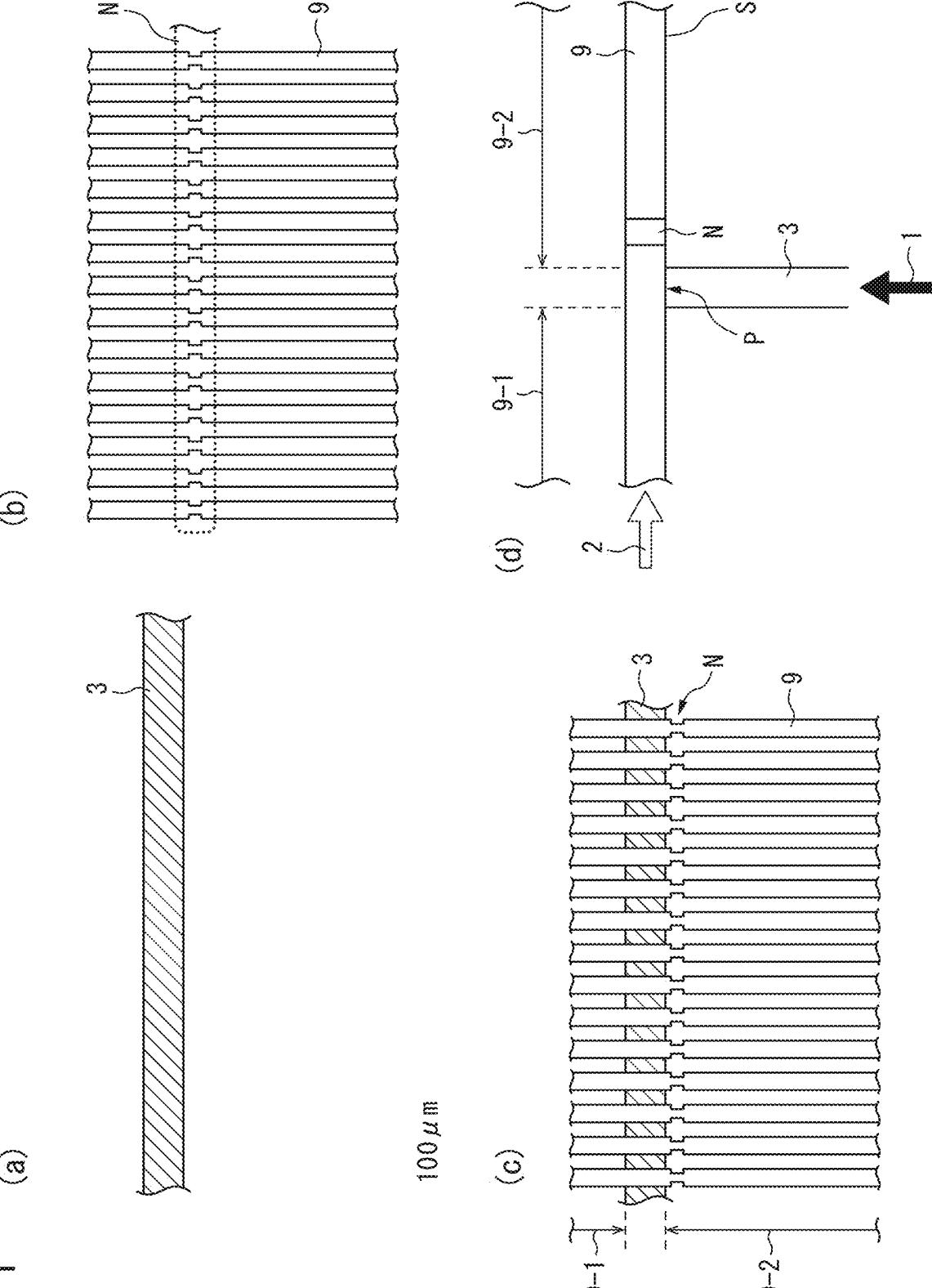
FIG. 1 is a diagram schematically showing a row of a plurality of microflow paths (9) and a slit (3) in a microdroplet/bubble-generating device of the invention.

FIG. 1 schematically shows examples of a row of plurality of microflow paths (9) and a slit (dispersion phase supply slit (3)). FIG. 1(*a*) is a schematic view of a slit (3), and FIG. 1(*b*) is a schematic plan view of a row of a plurality of microflow paths (9) from the direction perpendicular to the reference plane (S). FIG. 1(*a*) may also be an end view on the reference plane (S) of the slit (3). FIG. 1(*c*) is a schematic view showing a microdroplet/bubble-generating device having both the slit (3) and the row of the plurality of microflow paths (9), and FIGS. 1(*a*) and (*b*) are schematic views showing the mutual positional relationship between the slit (3) and the row of the plurality of microflow paths (9), as seen in the plan view from the direction perpendicular to the reference plane (S). FIG. 1(*d*) is a schematic side view of the device of FIG. 1(*c*). In FIG. 1(*b*), the plurality of microflow paths (9) have narrow parts (N) where the widths of the flow channels are narrowed, and as shown in FIGS. 1(*c*) and (*d*), each narrow part (N) is near the connection point (P) between the slit (3) and the microflow path (9). The narrow part (N) contacts with the connection point (P) between the slit (3) and microflow path (9), and there is no need for space between them. In FIG. 1(*d*), the slit end side face and the lower side face of the microflow path (9) are in contact, the plane of the slit end face and the lower side of the microflow path (9) being the reference plane (S). Referring to FIG. 1(*d*), the dispersion phase (1) is supplied from the slit (3) and the continuous phase (2) is supplied from the left side of the connection point (P) between the microflow path (9) and the slit (3), the continuous phase (2) flow and the dispersion phase (1) flow that have met at the connection point (P) between the microflow path (9) and the slit (3) flowing into the narrow part (N) and forming droplets/gas bubbles mainly at the outlet of the narrow part (N), and being guided to the liquid recovery port which is connected with the right side of the microflow path (9).

A device having the structure illustrated in FIG. 1(*a*) to (*d*) can be fabricated by attaching a part having a row of fine grooves for formation of the plurality of microflow paths (9) as shown in FIG. 1(*b*), onto a part having a slit (3) with the slit end face as shown in FIG. 1(*a*), to form the structure shown in FIGS. 1(*c*) and (*d*). By forming a row of plurality of fine grooves as shown in FIG. 1(*b*) on the surface on which the slit end face of the part with the slit (3) as shown in FIG. 1(*a*) (the order of formation of the slit and fine grooves may also be reversed), the surface of the part will have the slit and the row of a plurality of fine grooves as shown in FIG. 1(*c*), and fitting a cover over the part will form a device having the row of the plurality of microflow paths (9) and the slit (3) as shown in FIGS. 1(*c*) and (*d*). In this case, in FIG. 1(*d*), the surface of the part having the slit and the row of the plurality of fine grooves, i.e. the top side of the plurality of fine grooves, is not the reference plane (S), but rather the reference plane (S) is the lower side face of the plurality of microflow paths (9) (i.e. the plurality of fine grooves) and the flat surface which is joined with the slit. The reference plane (S) in this case is therefore an imaginary plane instead of the surface of the part.

The microdroplet/bubble-generating device (100) of the invention has a dispersion phase supply port (6), a continuous phase supply port (7) and a liquid recovery port (8). The dispersion phase supply port (6) is a transport channel that supplies the dispersion phase to the plurality of microflow paths (9), and it has a connection point (P) with each of the plurality of microflow paths (9). The continuous phase supply port (7) is a transport channel that supplies the continuous phase to the plurality of microflow paths (9), and it has a connection point (P) with each of the plurality of microflow paths (9). The liquid recovery port (8) is a transport channel that discharges droplets and gas bubbles generated by the plurality of microflow paths (9), and it also has a connection point (P) with each of the plurality of microflow paths (9).

According to the invention, at least one slit (hereunder also referred to as "specified slit") is one or more from among the continuous phase supply slit (4) and dispersion phase supply slit (3), the continuous phase supply slit (4) and dispersion phase supply slit (3) forming part of the dispersion phase supply port (6) and continuous phase supply port (7), respectively, and each having a connection point (P) with the plurality of microflow paths (9) as the end.

In the microdroplet/bubble-generating device (100) of the invention, each microflow path (9) of the plurality of microflow paths (9) has a first side microflow path (9-1) and a second side microflow path (9-2) on either side of the connection point (P) of each microflow path (9) with the specified slit (3, 4). The first side microflow path (9-1) is connected with either the continuous phase supply port (7) or the dispersion phase supply port (6), and the specified slit (3, 4) is connected with the other of the continuous phase supply port (7) and dispersion phase supply port (6). The continuous phase (2) is supplied from the continuous phase supply port (7) while the dispersion phase (1) is supplied from the dispersion phase supply port (6), and the second side microflow path (9-2) is connected with the liquid recovery port (8).

In the microdroplet/bubble-generating device (100) of the invention, the specified slit is situated so as to be between the dispersion phase supply port (6) or continuous phase supply port (7) and the liquid recovery port (8), as the location of connection with the plurality of microflow paths (9). When the specified slit (3, 4) is the continuous phase supply slit (4) it is sandwiched between the dispersion phase supply port (6) and liquid recovery port (8), and when the specified slit (3, 4) is the dispersion phase supply slit (3) it is sandwiched wherein the continuous phase supply port (7) and liquid recovery port (8).

The plurality of microflow paths (9) are configured so as to connect the end of the specified slit (3, 4) with the supply port (6, 7) and the liquid recovery port (8) on both sides of the slit (3, 4), in the plane, perpendicular to the specified slit (3, 4), and where is the end of the specified slit (3, 4) (the reference plane (S)). The supply port (6, 7) and the liquid recovery port (8) on both sides of the slit (3, 4) are the nearest supply port (6, 7) and liquid recovery port (8) on both sides of the specified slit (3, 4).

In the microdroplet/bubble-generating device (100) having this construction, the dispersion phase (1) is supplied from the dispersion phase supply port (6) while the continuous phase (2) is supplied from the continuous phase supply port (7), and either one of the dispersion phase (1) and continuous phase (2) is distributed into the plurality of microflow paths (9). Here, "distributed into the plurality of microflow paths (9)" means that the dispersion phase (1) and/or continuous phase (2) supplied from the dispersion phase supply port (6) and/or continuous phase supply port (7) is distributed into the plurality of microflow paths that are between the dispersion phase supply port (6) and/or continuous phase supply port (7) and the specified slit (3, 4) (the first side microflow path (9-1)). When only either one of the dispersion phase (1) and continuous phase (2) is distributed into the plurality of microflow paths, the other of the dispersion phase (1) and continuous phase (2) is supplied into the specified slit (3, 4), and eventually the dispersion phase (1) and continuous phase (2) both reach each connection point (P) between the specified slit (3, 4) and plurality of microflow paths (9).

In the microdroplet/bubble-generating device (100) of the invention, as explained above, each of the plurality of microflow paths (9) has a first side microflow path (9-1) and a second side microflow path (9-2) on either side of the connection point (P) thereof with the specified slit (3, 4). The first side microflow path (9-1) is connected with either the continuous phase supply port (7) or the dispersion phase supply port (6), and the specified slit (3, 4) is connected with the other of the continuous phase supply port (7) and dispersion phase supply port (6). The plurality of microflow paths (9) each have, in the second side microflow path (9-2), a narrow part (N) where the cross-sectional area of the flow channel is locally narrowed, in contact with or near the connection point (P) between the microflow path (9) and the specified slit (3, 4) narrow part.

According to the invention, each second side microflow path (9-2) has a narrow part (N) where the cross-sectional area of the flow channel is locally narrowed, adjacent to or near the connection point (P) between each microflow path and the specified slit (3, 4), i.e. essentially continuous with the connection point (P) (for simplicity hereunder, "near or essentially continuous" will collectively be referred to as "continuous"), and therefore the continuous phase (2) and dispersion phase (1) that have met at the connection point (P) between the microflow path (9) and the specified slit (3, 4) basically maintain continuous flows of the continuous phase (2) and dispersion phase (1), respectively, while the flow of the continuous phase (2) allows the dispersion phase (1) to flow into the narrow part (N) while still being without completely sheared and without forming droplets or gas bubbles. At the narrow part (N) that is continuous with the connection point (P) between the microflow path (9) and the specified slit (3, 4), flow of the continuous phase (2) and flow of the dispersion phase (1) have a locally increased flow rate due to the narrower cross-sectional area of the flow channel. The dispersion phase (1) is sheared with the flow of the continuous phase (2) as the driving force that has an increased flow rate at the narrow part (N), forming droplets or gas bubbles of the dispersion phase (1) at the narrow part (N). According to the invention, "droplets or gas bubbles are formed at the narrow part" means that droplets or gas bubbles are formed in the narrow part (N) and near the outlet of the narrow part (N).

According to the invention, at least the following effects are obtained as a result of formation of droplets or gas bubbles using the narrow part (N).

i) In a device having a narrow part (N) of the invention, the sizes of droplets or gas bubbles of the dispersion phase (1), that are formed as a result of droplet or gas bubble formation of the dispersion phase (1) when the dispersion phase (1) is sheared with the flow of the continuous phase (2) as the driving force that has accelerated at the narrow part (N) with a small cross-sectional area, can be smaller sizes than without the narrow part (N) if the flow rates of the continuous phase (2) and dispersion phase (1) are the same, making it possible to increase the density (number density) of the droplets or gas bubbles.

ii) In a device having a narrow part (N) of the invention, the narrow parts of the flow channels that produce pressure loss (the narrow parts (N)) are minimized, allowing pressure loss to be drastically reduced compared to simply using small-sized flow channels without narrow parts (N), so that droplets or gas bubbles can be formed with lower pressure loss and lower risk of clogging in the device as a whole.

iii) In a device having a narrow part (N) of the invention, when droplets or gas bubbles of the desired size are to be obtained with the same dispersion phase flow rate, they can be obtained with a lower continuous phase flow rate than when narrow parts (N) are absent. As a result, it is possible to achieve a higher dispersion phase volume ratio and to reduce consumption of the continuous phase, while also forming rows of droplets or gas bubbles with higher number density.

iv) In a device having a narrow part (N) of the invention, the site of droplet or gas bubble formation can be moved further downstream from the specified slit (3, 4) to the second side microflow path (9-2), compared to one without a narrow part (N). This can inhibit the disturbing effect on droplets or gas bubbles by fine irregular concavoconvexities created during working, such as microdefects or bristles, at the corners of the specified slit (3, 4) contacting with the second side microflow path (9-2).

At the connection point (P) between each of the plurality of microflow paths (9) and slit (3, 4), the continuous phase (2) and dispersion phase (1) meet and the continuous phase (2) takes up the dispersion phase (1), forming a multiphase flow of the continuous phase (2) and dispersion phase (1) (usually a laminar flow in which the flow of the continuous phase (2) partially surrounds the flow of the dispersion phase (1)), which flows toward the narrow part (N) of the second side microflow path (9-2). In the absence of a narrow part (N), the dispersion phase (1) is sheared in the second side microflow path (9-2) with the flow of the continuous phase (2) as the driving force, forming droplets or gas bubbles of the dispersion phase (1). However, with a narrow part (N) in contact with or almost in contact with (near) the connection point (P) between each of the plurality of microflow paths (9) and the slit (3, 4), the multiphase flow of the continuous phase (2) and dispersion phase (1) flowing at the connection point (P) flows into the narrow part (N) without formation of droplets or gas bubbles of the dispersion phase (1), increasing the flow rate by the narrow structure of the narrow part (N), and consequently causing the dispersion phase (1) to be sheared with the flow of the continuous phase (2) as the driving force, and forming droplets or gas bubbles of the dispersion phase (1) mainly at the outlet end of the narrow part (N). In order to form droplets or gas bubbles of the dispersion phase (1) using the narrow part (N), the multiphase flow of the continuous phase (2) and dispersion phase (1) formed at the connection point (P) preferably flows into the narrow part (N) before droplets or gas bubbles of the dispersion phase (1) are formed at the second side microflow path (9-2).

The narrow part (N) is the site where the cross-sectional area of the flow channel is locally narrowed at a specific location of the second side microflow path (9-2) (in contact with or near the connection point (P)). The cross-sectional shape of the narrow part (N) may be selected from among rectangular, trapezoid, triangular, polygonal, half-circular, circular, elliptical, half-elliptical shapes and the like, depending on the materials to be worked and the working means. It is sufficient if the cross-sectional area of each flow channel is locally narrowed compared to the cross-sectional area of the second side microflow path (9-2), and the width of the flow channel in the plan view of the row of the plurality of microflow paths (9) may narrow, or the heights of the flow channels in the cross-section perpendicular to the reference plane (S) of the row of the plurality of microflow paths (9) may narrow, or both. Preferably they narrow at the centers in the width or height direction of the plurality of microflow paths (9), but they may narrow at any location.

The area of the cross-section of each narrow part (N) is in the range of $1/100$ to $1/1.5$, preferably $1/10$ to $1/2$, and more preferably $1/5$ to $1/3$, of the area of the cross-section of the second side microflow path (9-2) other than at the narrow part (N). The area of the cross-section of the narrow part (N) is the average value of the areas of the cross-sections of the narrow parts (N). The area of the cross-section of the microflow path at the section between the connection point (P) and the narrow part (N) is satisfactory if it is larger than the area of the cross-section of the narrow part (N), and may be selected on the same criteria as the microflow path at the other sections, but for most cases it may be the same as the area of the cross-section of the second side microflow path (9-2) on the side of the narrow part (N) opposite from the connection point (P). Therefore the area of the cross-section of the microflow path (9-2) as the basis for measuring the area of the cross-section of the narrow part (N) is the area of the cross-section of the second side microflow path (9-2) on the side of the narrow part (N) opposite from the connection point (P). The second side microflow path (9-2) will usually be linear with a constant cross-sectional area, but when the cross-sectional area varies in the flow channel direction, the cross-sectional area at the section nearest to the narrow part (N) of the second side microflow path (9-2) is used. For example, the dimension in the direction of flow of the microflow path (9-2) as the basis for measuring the area of the cross-section of the narrow part (N) is sufficient if it is at least 2 times, at least 3 times or at least 5 times (the length of) the width of the slit end face (the dimension in the direction of flow of the microflow path) nearest to the narrow part (N). If the cross-section of the narrow part (N) is smaller than the cross-section of the second side microflow path (9-2), and especially smaller than $1/1.5$, then it will be possible to obtain the effect of providing the narrow parts (N), such as further reducing the dimensions of the droplets or gas bubbles that are formed or further increasing the density (number) of the droplets or gas bubbles formed. The cross-section of the narrow part (N) is preferably not too small compared to the cross-section of the second side microflow path (9-2), and especially it is preferably at least $1/100$ of the area of the cross-section of the microflow path on the second side other than at the narrow part (N), so that the pressure loss will not excessively increase. If the size of the narrow part is too small with respect to the size of the microflow path, then pressure loss due to the narrow part will increase and clogging may occur, while it will also be difficult to control the sizes of droplets formed at the narrow part, and more specifically, small droplets similar to the size of the narrow part cross-section will be formed but it may be difficult to form larger droplets similar to the size of the microflow path cross-section (the tip of the dispersion phase will undergo shear before growing large inside the microflow path).

For this reason, the square root of the cross-sectional area of the narrow part (N) according to one aspect of the invention may be in the range of 0.1 to 1000 μm, preferably 1 to 100 μm and more preferably 10 to 50 μm.

The length of the narrow part (N) in the flow channel direction may be in the range of 0.01 to 10 times, preferably 0.1 to 2 times and more preferably 0.2 to 1 times the square root of the area of the cross-sectional dimension of the second side microflow path (9-2). The cross-sectional area of the second side microflow path (9-2) is measured as described above. The length of the narrow part (N) in the flow channel direction is preferably greater than a fixed value, and in particular it is preferably at least 0.01 times the square root of the area of the cross-sectional dimension of the second side microflow path (9-2), as this will allow the structure of the narrow part (N) to be made more thick and firm. Preferably, the length of the narrow part (N) in the flow channel direction is also small, and in particular it is no more than 10 times the square root of the area of the cross-sectional dimension of the second side microflow path (9-2), as this will result in smaller dimensions of the narrow part (N) that has a narrow cross-sectional area, allowing pressure loss in the narrow part (N) to be reduced. If the length of the narrow part (N) in the flow channel direction is smaller than the cross-sectional size of the microflow path, the structure may have an extremely thin narrow part (for example, a 1 μm-long narrow part in the 100×100 μm flow channel), such a structure being fragile against flow of the dispersion phase and continuous phase and raising concerns regarding durability. If the narrow part is too long, on the other hand, the path itself may be a microflow path, preventing function of the narrow part, and potentially resulting in failure of the tip of the dispersion phase flow to reach the narrow part outlet and constant earlier formation of droplets in the narrow part.

For this reason, the length of the narrow part (N) in the flow channel direction according to one aspect of the invention may be in the range of 0.1 to 1000 μm, preferably 1 to 200 μm and more preferably 10 to 100 μm.

The narrow part (N) is in contact with the connection point (P) between each of the plurality of microflow paths (9) and slit (3, 4) or near it (almost in contact with the connection point (P)), but the distance from the connection point (P) to the narrow part (N) may be up to 5 times, preferably up to 2 times and more preferably up to the same as the square root of the cross-sectional area of the microflow path (9) on the second side (all of these ranges including zero). In this case as well, the cross-sectional area of the narrow part (N) is the average value of the areas of the cross-sections of the narrow parts (N). Since the cross-sectional area of the microflow path at the section between the connection point (P) and the narrow part (N) is satisfactory if it is larger than the area of the cross-section of the narrow part (N), for most cases it may be the same as the area of the cross-section of the second side microflow path (9-2) on the side of the narrow part (N) opposite from the connection point (P). Therefore the cross-sectional area of the microflow path (9-2) as the basis for measuring the cross-sectional area of the narrow part (N) is the cross-sectional area of the second side microflow path (9-2) on the side of the narrow part (N) opposite from the connection point (P). The second side microflow path (9-2) will usually be linear with a constant cross-sectional area, but when the cross-sectional area varies in the flow channel direction, the cross-sectional area at the section nearest to the narrow part (N) of the second side microflow path (9-2) is used. For example, the dimension in the direction of flow of the microflow path (9-2) as the basis for measuring the cross-sectional area of the narrow part (N) is sufficient if it is at least 2 times, at least 3 times or at least 5 times (the length of) the width of the slit end face nearest to the narrow part (N) (the dimension in the direction of flow of the microflow path). If the distance from the slit to the narrow part (N) is too long, the dispersion phase will shear and form droplets before reaching the narrow part (N) with the droplets flowing into the narrow part (N) and, depending on the droplet sizes, being split at the narrow part (N) (in a non-uniform manner), resulting in potential loss of the monodisperse property of the droplet sizes, and therefore the distance from the connection point (P) to the narrow part (N) is preferably no greater than 5 times the square root of the cross-sectional area of the microflow path (9) on the second side.

For this reason, the distance from the connection point (P) between each of the plurality of microflow paths (9) and the slit (3, 4) to the narrow part (N) according to one aspect of the invention may be 1000 μm or smaller (including zero), preferably 400 μm or smaller (including zero) and more preferably 200 μm or smaller (including zero). The distance from the slit (3, 4) to the narrow part (N) only needs to be smaller than a specified length as mentioned above, and does not need to be the same for all of the microflow paths in the row of the plurality of microflow paths. The distance may also be zero, but if the distance is larger than a given range, depending on the flow rate conditions, flow from the slit side will tend to form droplets or gas bubbles of the dispersion phase (1) before entering the narrow part (N).

If the plurality of microflow paths (9) and slit (3, 4) are on the same side of the reference plane (S), connecting the narrow part (N) of the microflow path (9) with the slit (3, 4) will cause the narrow part (N) to be integrated with the slit (3, 4), and the edge of the narrow part (N) will match the location in contact with the connection point (P) between each of the plurality of microflow paths (9) and the slit (3, 4). The distance from the connection point (P) to the narrow part (N) in this case will be zero. According to the invention, however, the plurality of microflow paths (9) and the slit (3, 4) can be provided separately on either side of the reference plane (S), in which case part of the narrow part (N) can be overlapping with the connection point (P) in the plan view of the reference plane (S). If part of the narrow part (N) is thus overlapping with the connection point (P) in the plan view of the reference plane (S), the flow channels of the continuous phase (2) and dispersion phase (1) will be connected with the connection point (P), and the distance from the connection point (P) to the narrow part (N) will therefore be zero, or in other words the narrow part (N) may be considered to be adjacent to the connection point (P) for the purpose of the invention.

According to the invention, the width of the slit (3, 4) may be in the range of 1 to 1000 μm, preferably 10 to 500 μm and more preferably 20 to 200 μm, for example, at the end of the slit (3, 4) in the reference plane (S). The width of the slit (3, 4) is preferably at least a fixed value in order to reduce pressure loss. The width of the slit (3, 4) is also preferably less than a fixed value in order to increase the flow stability and form fine droplets or gas bubbles. If the width of the slit (3, 4) is too small there will be a risk of clogging and increased pressure loss making it difficult to achieve flexible flow control, while if the width of the slit (3, 4) is too large there will be a risk of greater disturbance of flow in the slit and disturbance at the interface formed between the dispersion phase and continuous phase, resulting in variation in the droplet formation in each microflow path and potential impairment of the monodisperse property of the generated droplets, and therefore the width of the slit (3, 4) is preferably 1 to 1000 μm at the end of the slit (3, 4) in the reference plane (S).

If the dispersion phase (1) is sheared in the narrow part (N) with the flow of the continuous phase (2) as the driving force, forming droplets or gas bubbles of the dispersion phase (1), then the product will be collected from the liquid recovery port (8) connected with the second side microflow path (9-2). The liquid recovery port (8) is connected with the side of the narrow part (N) of the second side microflow path (9-2) that is opposite from the connection point (P) between the microflow path (9) and the slit (3, 4). The portion where the liquid recovery port (8) is connected with the second side microflow paths (9-2) among the row of the plurality of microflow paths (9) may be an additional slit (5) or a cylindrical hole (5-1), in which case the additional slit (5) or cylindrical hole (5-1) forms part of the liquid recovery port (8). Alternatively, in the flat plane in which the row of the plurality of microflow paths (9) is formed, the region from the row of the plurality of microflow paths (9) to the end of the liquid recovery port (8) that opens into the flat plane may be connected by each microflow path (9), so that product can be collected from the liquid recovery port (8).

Droplets or gas bubbles are generated at the connection point (P) between the specified slit (3, 4) and the microflow paths (9), and the narrow part (N). The connection points (P) between the specified slit (3, 4) and the microflow paths (9) on both sides of the specified slit (3, 4) are the points where the specified slit meets the microflow paths (9-1, 9-2) on both sides of the specified slit (3, 4), but the locations where the microflow paths (9-1, 9-2) on both sides of the specified slit (3, 4) meet do not necessarily have to be the same location of the specified slit (3, 4), and may be locations at slightly shifted positions (see FIG. 4). The dispersion phase (1) and continuous phase (2) are supplied to the specified slit (3, 4) and the microflow paths (9-1) on one side (first side), the dispersion phase (1) undergoing shear with the flow of the continuous phase (2) as the driving force at each site where the flow channel of the dispersion phase (1) and the flow channel of the continuous phase (2) meet (the connection point (P)) and at the narrow part (N) that is either continuous or almost continuous with the meeting site, whereby droplets or gas bubbles of the dispersion phase (1) are generated and recovered as product (droplets or gas bubbles) from the flow channel other side of the microflow paths (9) (the second side).

Thus, while the specified slit (3, 4) forms part of the dispersion phase supply port (6) or continuous phase supply port (7) as mentioned above, at the same time it also serves as an element providing the function of generating droplets or gas bubbles of the dispersion phase (1) from the dispersion phase (1) and continuous phase (2), at the composite structure of the connection point (P) of the specified slit (3, 4) with the microflow paths (9) on both sides of the specified slit (3, 4) and the narrow parts (N).

In the microdroplet/bubble-generating device of the invention, the specified slit (dispersion phase or continuous phase supply port) and the supply port/liquid recovery port on both sides thereof are not limited to be different supply port/liquid recovery port, and either or both the slit and the supply port/liquid recovery port on either side (both sides) may be the same supply port/liquid recovery port. The microdroplet/bubble-generating device of the invention may have one specified slit, or two or more. When it has two or more specified slits, one example is where the supply port and liquid recovery port are configured in the reference plane in the order: <continuous phase supply port-dispersion phase supply port (#1)-dispersion phase supply port (#2)-liquid recovery port>, the dispersion phase supply port (#1) and dispersion phase supply port (#2) being specified slits, and the microflow paths (9) connecting their supply ports and liquid recovery ports. The dispersion phase supply port (#1) and dispersion phase supply port (#2) have, on one of both sides of each, the same dispersion phase supply ports as the specified slits (3, 4). However, the dispersion phase supply port (#1) and dispersion phase supply port (#2) are still both configured in a manner sandwiched between the continuous phase supply port and liquid recovery port. In the example of <continuous phase supply port-dispersion phase supply port (#1)-dispersion phase supply port (#2)-liquid recovery port> mentioned above, either or both, and especially both, of the dispersion phase supply port (#2) side of the dispersion phase supply port (#1) and the liquid recovery port side of the dispersion phase supply port (#2), are provided with narrow parts (N).

In the microdroplet/bubble-generating device (100) of the invention, the continuous phase supply port (7), dispersion phase supply port (6) and liquid recovery port (8), which are other than the specified slit (3, 4), may also be slits (additional slits) at the ends thereof connected with the microflow paths (9). The additional slits are one or more from among the continuous phase supply slit (4), dispersion phase supply slit (3) and liquid recovery port (8), with the continuous phase supply slit (4), dispersion phase supply slit (3) and liquid recovery slit (5) forming part of the dispersion phase supply port (6), continuous phase supply port (7) and liquid recovery port (8), respectively, and having the connection points (P) with the plurality of microflow paths (9) as their ends. Therefore, while there is at least one specified slit (3, 4) in the microdroplet/bubble-generating device (100) of the invention, the number of slits (3, 4, 5) may be more than the number of specified slit(s) (3, 4). For example, when the configuration in the reference plane (S) is in the order: <continuous phase supply port-dispersion phase supply port-liquid recovery port> and the dispersion phase supply port (6) is the specified slit, the ends of the continuous phase supply port (7) and liquid recovery port (8) may optionally be additional slits. Alternatively, the ends of the continuous phase supply port (7) and liquid recovery port (8) may be cylindrical holes (5-1).

For generation of droplets according to the invention, the liquids forming the dispersion phase (1) and continuous phase (2) are preferably an organic compound or water. The organic compound is not particularly restricted, but it is preferably an alkane such as decane or octane, a halogenated hydrocarbon such as chloroform, an aromatic hydrocarbon such as toluene or a fatty acid such as oleic acid. In order to obtain solid or gel-like microparticles, the dispersion phase (1) used may be an aqueous phase or organic phase that can be hardened by thermal- or photo-polymerization reaction, and the material used may be a known polymerizable monomer, oligomer or polymer, for example, and is preferably an acrylate-based monomer or styrene-based monomer.

For generation of droplets, the combination of dispersion phase (1) and continuous phase (2) may usually be an oil-in-water (O/W), oil-in-oil (O/O) or water-in-oil (W/O) type.

For generation of gas bubbles according to the invention, the dispersion phase (1) may be a gas and the continuous phase (2) may be a liquid composed of an aqueous phase or organic phase. The gas is not particularly restricted and may be air, oxygen, nitrogen, carbon dioxide or argon gas.

The flow rate of the dispersion phase (1) and continuous phase (2) per single microflow path (9) will depend on the type, but it will usually be selected to be about 0.001 mL to 10 mL/hr.

The microdroplet/bubble-generating device (100) of the invention will now be described using embodiments.

Embodiment 1

Figures 1, 2:
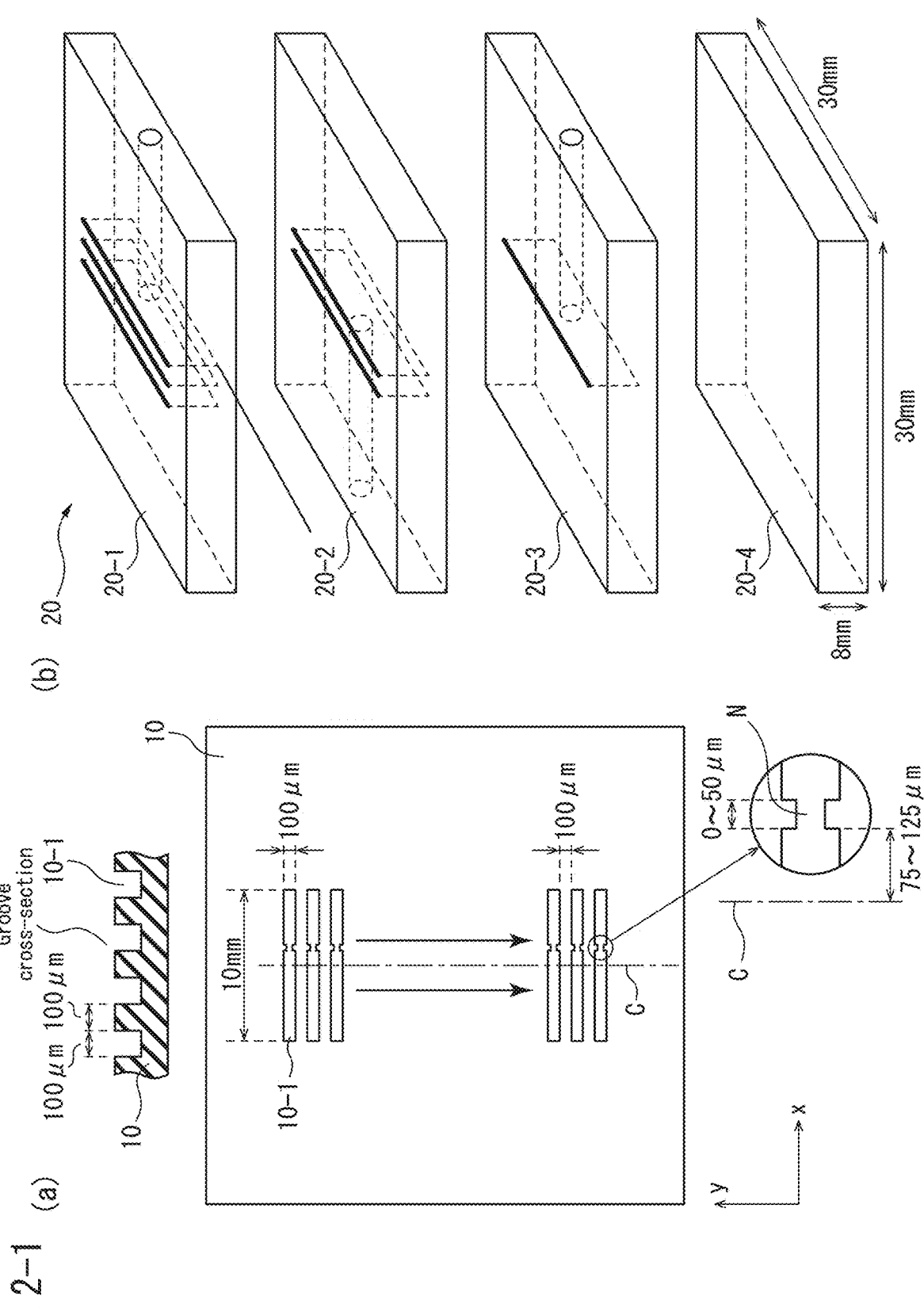
Figure 2:
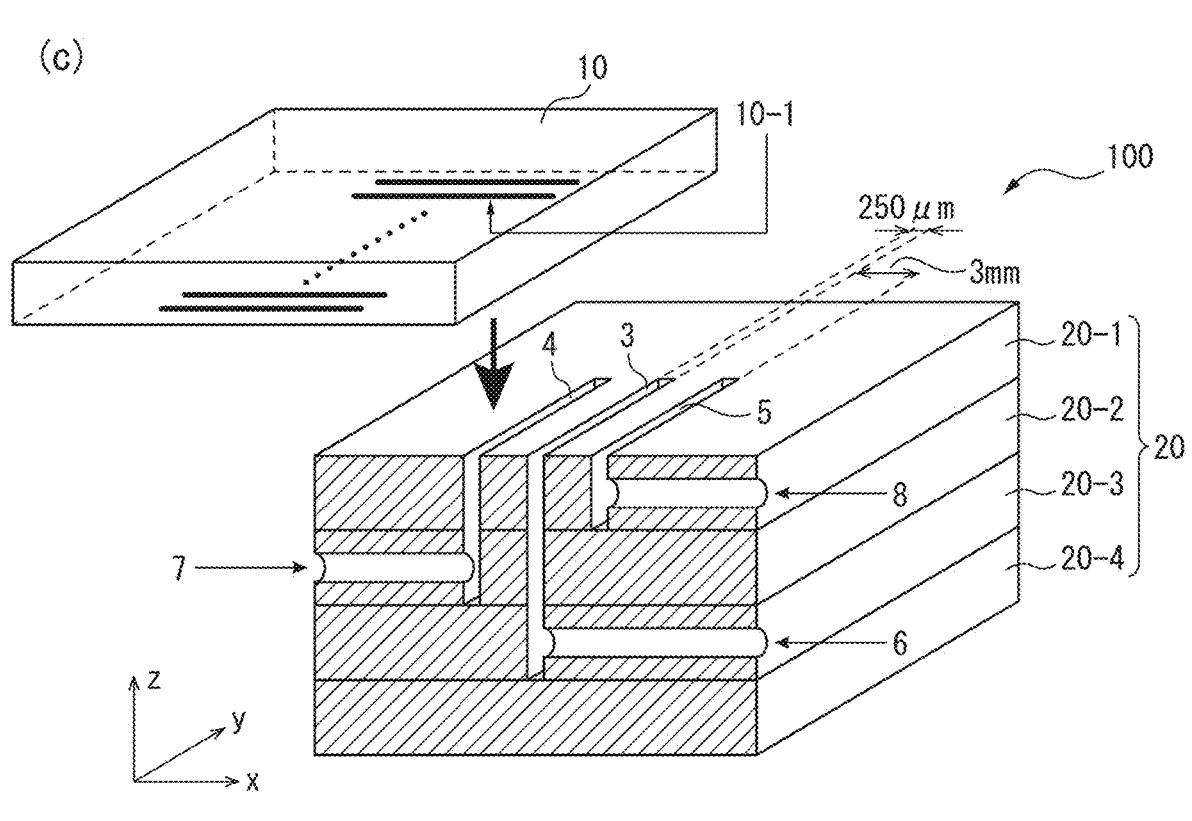
Figure 2:
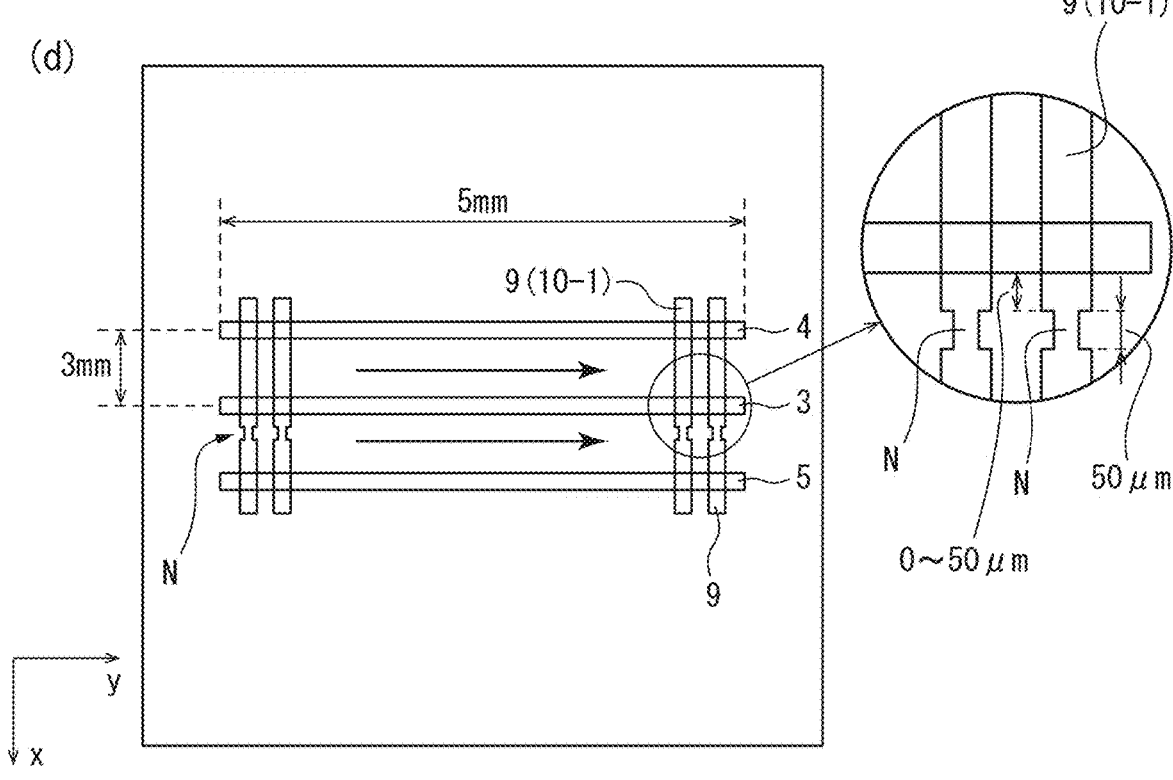
Figure 2:
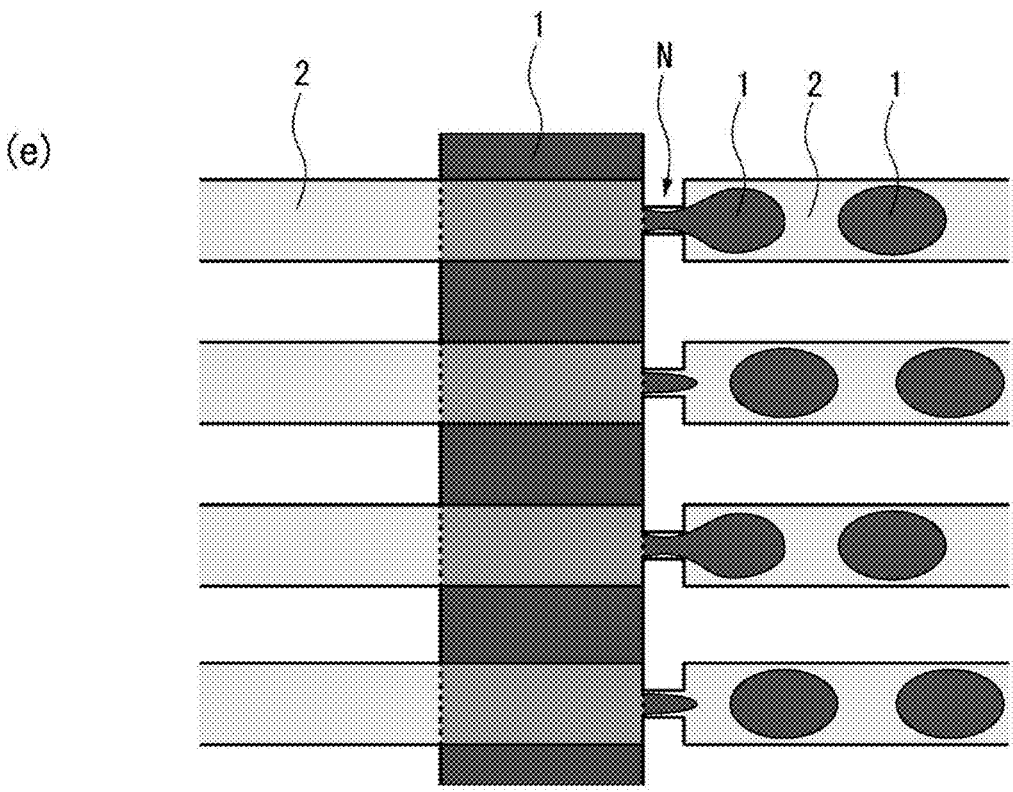
Figure 3:
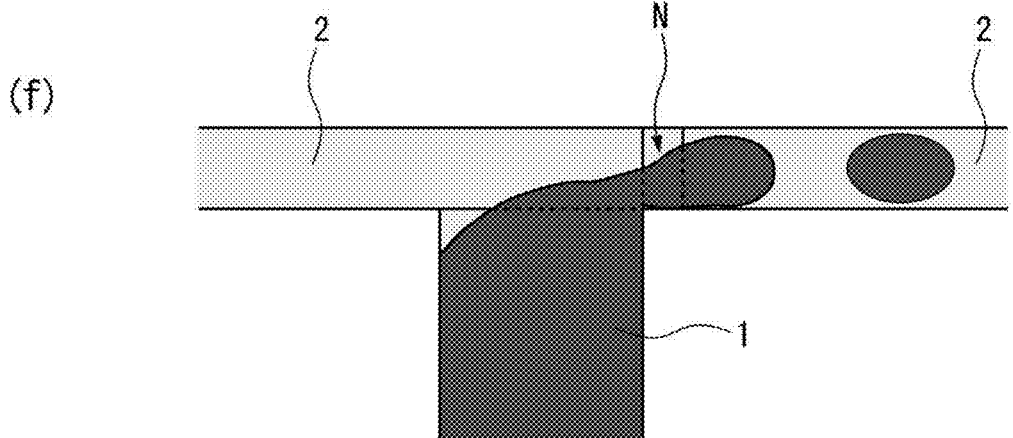
Figures 1, 3:
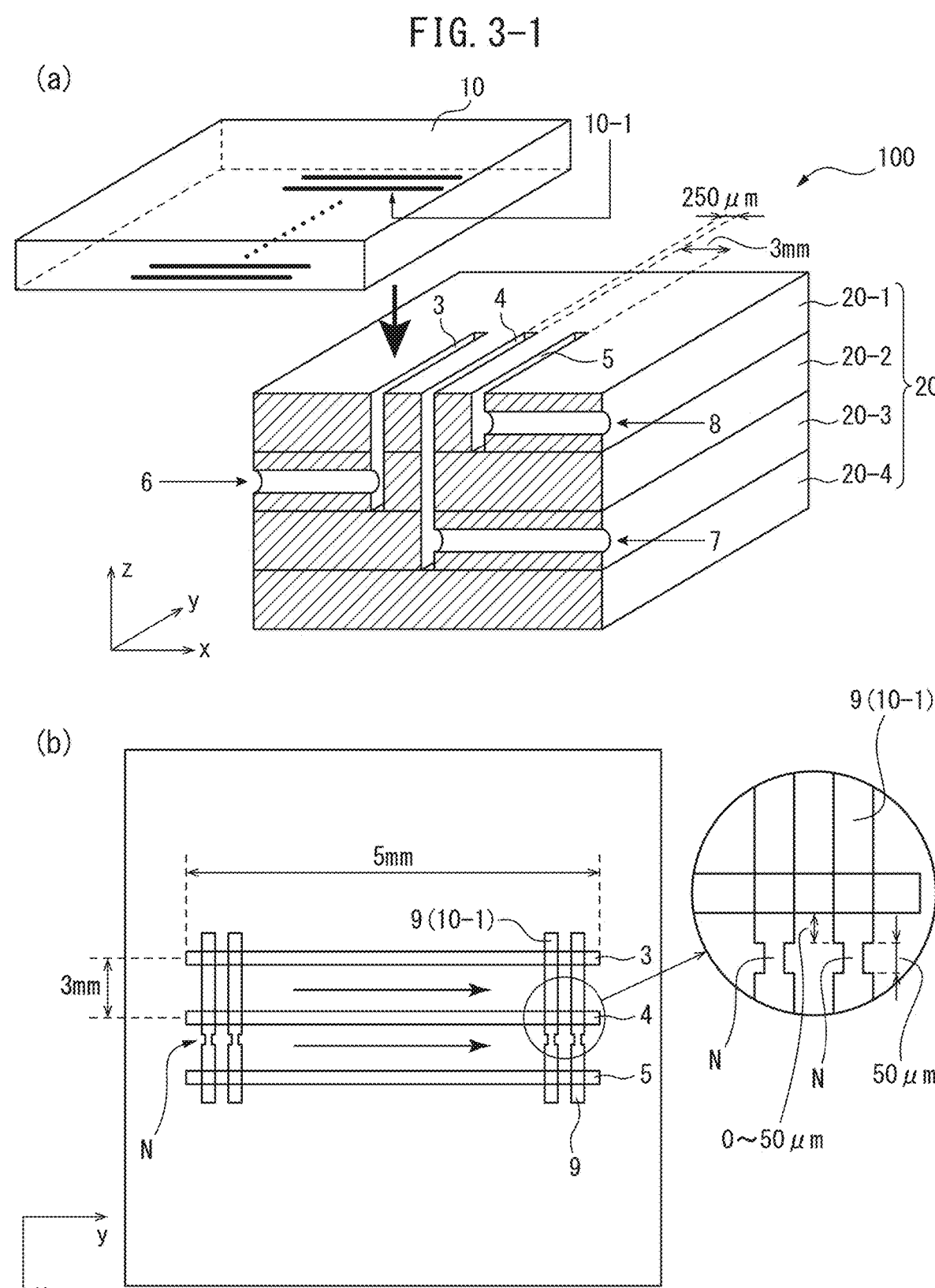
Figure 3:
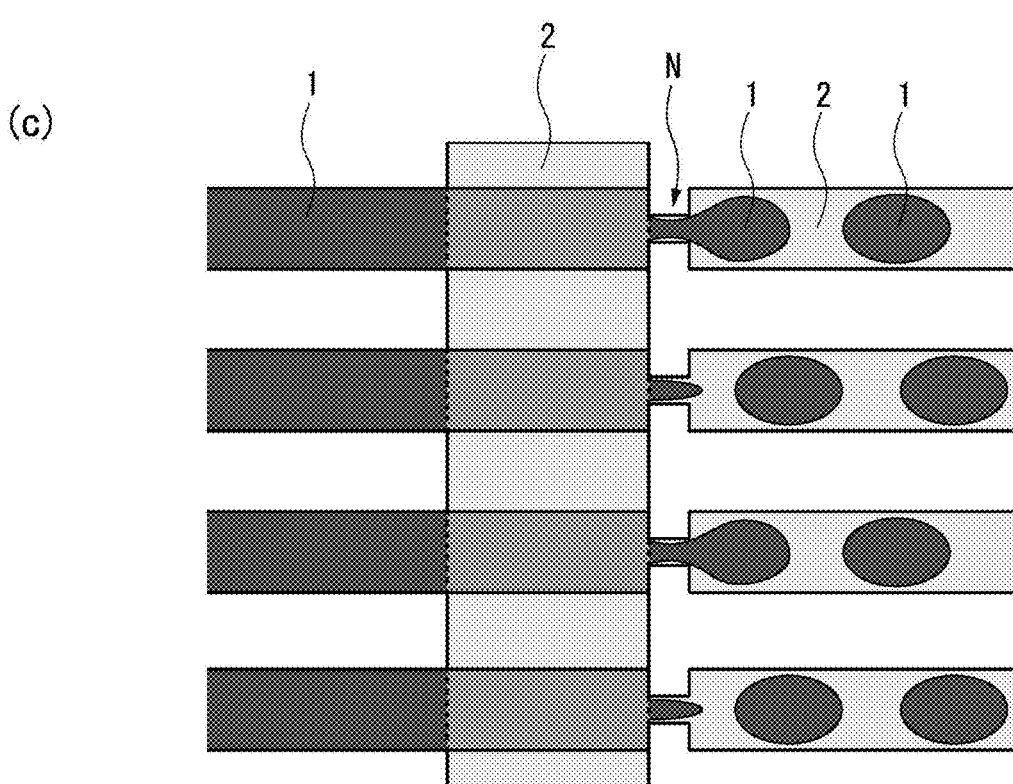
Figure 2:
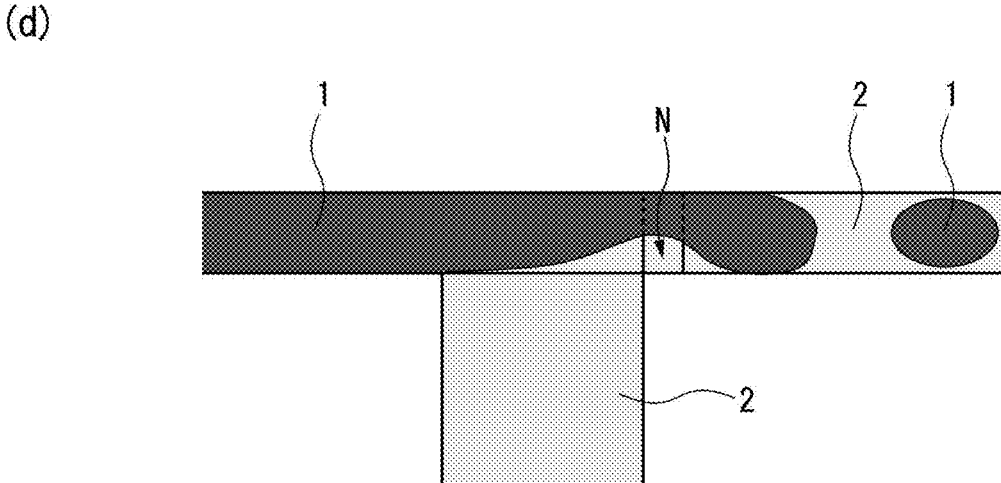

According to embodiment 1 of the invention, the micro-droplet/bubble-generating device (100) is constructed of an array panel (10) with a plurality of paralleled straight linear fine grooves having a rectangular cross-sectional shape, and a liquid- or gas-distributing part (20) (FIG. 2-1 to FIG. 2-3). Referring to FIG. 2-1(a) and FIG. 2-2(d), the fine groove array panel (also referred to as "microflow channel array") (10) has 16 straight linear fine grooves (10-1) with rectan-gular cross-sectional shapes (100 μm width, 100 μm height), the gaps between the adjacent grooves being 100 μm (FIG. 2-1(a)). The lengths of the fine grooves are 10 mm, with lengths of 4.875 mm or greater on both sides of the center axis line (C) in the fine groove direction of the fine groove array panel. Each fine groove (10-1) has a narrow part (N) where the cross-sectional area of the groove is narrowed, at a location at a distance in the range of 125 μm to 175 μm from the center axis line (C) of the fine groove array panel (10) toward one end (the right side in FIG. 2-1(a)), the narrow part (N) having a rectangular cross-section (50 μm width, 100 μm height) and a length of 50 μm.

Referring to FIG. 2-1(b) and FIG. 2-2(c), the liquid- or gas-distributing part (20) is constructed of four members (20-1, 20-2, 20-3, 20-4) with widths of 30 mm, lengths of 30 mm and heights of 8 mm. The first member (20-1) at the uppermost section has a continuous phase supply slit (4), a dispersion phase supply slit (3), a product liquid recovery slit (5) and a liquid recovery port (8). The second member (20-2) at the second level from the top has a continuous phase supply slit (4), a dispersion phase supply slit (3) and a continuous phase supply port (7). The third member (20-3) at the third level from the top has a dispersion phase supply slit (3) and a dispersion phase supply port (6). The fourth member (20-4) at the lowermost section is a flat plate that closes the through-pore formed in the bottom of the third member (20-3) by the dispersion phase supply slit (3). FIG. 2-2(c) shows a cross-sectional perspective view where the first to fourth members of the liquid- or gas-distributing part (20) are combined. The dispersion phase (1) and continuous phase (2) that are supplied, flow from the lower layer through the slit-shaped flow channels (3, 4) inside the part (20), and are supplied to the top of the liquid- or gas-distributing part (20). That is, the dispersion phase (1) is supplied from the dispersion phase supply port (6) of the third member (20-3) into the dispersion phase supply slit (3), the continuous phase (2) is supplied from the continuous phase supply port (7) of the second member (20-2) into the continuous phase supply slit (4), and the continuous phase (2) and dispersion phase (1) are each directed upward in the respective slit (3, 4). Here, in order to emphasize the shapes of the slits, the portions other than the slits are expressed as the dispersion phase supply port (6), continuous phase supply port (7) and liquid recovery port (8), but according to the disclosure the slits are functionally portions of the dispersion phase supply port (6), continuous phase supply port (7) and liquid recovery port (8), as mentioned above (this implicitly also applies to the embodiments described below).

The fine groove array panel (10) is positioned to match the three slits on the liquid- or gas-distributing part (20), i.e. the continuous phase supply slit (4), the dispersion phase supply slit (3) and the product liquid recovery slit (5), and is bonded as shown in FIG. 2-2(d) in the plan view from above the fine groove array panel (10). The long side widths at the slit end sections (slit end faces) are 5 mm, the short side widths are 250 μm and the pitch between slits (center distance) is 3 mm, the slits being separated apart by 2.75 mm. A narrow part (N) with a width of 50 μm and a length of 50 μm is present at intervals in a range of 0 to 50 μm from the dispersion phase supply slit (3) on the product discharge slit (5) side. In FIG. 2-2(d), the continuous phase (2) is supplied to the top slit (4) and the dispersion phase (1) is supplied to the center slit (3), the continuous phase (2) being supplied to the microflow paths (9) formed by the fine grooves (10-1), and the product generated at the connection points (P) between the disper-sion phase supply slit (3) and the microflow paths (9) as well as the narrow part (N) is recovered through the microflow paths (9) from the slit (5) at the lower end.

FIG. 2-3(e) and (f) show the state where a droplet or gas bubble is generated inside the device (100). The dispersion phase (1) is taken up into the flow of the continuous phase (2) at the connection points (P) between the dispersion phase supply slit (3) and microflow paths (9), the flows of the continuous phase (2) and of the dispersion phase (1) enter into the narrow part (N) while they are keeping continuous flows, the flows of the continuous phase (2) and dispersion phase (1) have an increased flow rate inside the narrow parts (N) where the cross-sectional area of the flow channels is narrowed, and the increased flow rate of the continuous phase (2) causes the dispersion phase (1) to be sheared at the location where the cross-sectional area of the flow channel spreads out at the outlet of the narrow part (N), resulting in formation of smaller, more high density (greater number of) droplets or gas bubbles, compared to a case where no narrow part (N) is present, if the flow rate conditions are the same for the continuous phase (2) and dispersion phase (1). The product is recovered through the liquid recovery slit (5) from the liquid recovery port (8).

Embodiment 2

Embodiment 2 of the invention is similar to embodiment 1, but differs in that the configuration of each continuous phase supply slit (4) and dispersion phase supply slit (3) in the liquid- or gas-distributing part (20) is reversed (FIG. 3-1 to FIG. 3-2). For embodiment 2, the fine groove array panel (10) is similar to embodiment 1 (FIG. 3-1(b)). The liquid- or gas-distributing part (20) is constructed of four members (20-1, 20-2, 20-3, 20-4). Referring to FIG. 3-1(b), the first member (20-1) at the uppermost section has a continuous phase supply slit (4), a dispersion phase supply slit (3), a product liquid recovery slit (5) and a liquid recovery port (8). The second member (20-2) at the second level from the top has a continuous phase supply slit (4), a dispersion phase supply slit (3) and a dispersion phase supply port (6). The third member (20-3) at the third level from the top has a continuous phase supply slit (4) and a continuous phase supply port (7). The fourth member (20-4) at the lowermost section is a flat plate that closes the through-pore formed in the bottom of the third member (20-3) by the continuous phase supply slit (4) (FIG. 3-1(a)). FIG. 3-1(a) shows a cross-sectional perspective view where the first to fourth members of the liquid- or gas-distributing part (20) are combined. The dispersion phase (1) and continuous phase (2) that are supplied, flow from the lower layer through the slits, and are supplied to the top of the liquid- or gas-distributing part (20). That is, the dispersion phase (1) is supplied from the dispersion phase supply port (6) of the second member (20-2) into the dispersion phase supply slit (3), and the continuous phase (2) is supplied from the continuous phase supply port (7) of the third member (20-3) into the continuous phase supply slit (4), with the continuous phase (2) and dispersion phase (1) each being directed upward into the respective slits.

The fine groove array panel (10) is positioned to match the three slits on the liquid- or gas-distributing part (20), i.e. the continuous phase supply slit (4), the dispersion phase supply slit (3) and the liquid recovery slit (5), and is bonded as shown in FIG. 3-1(*b*) in the plan view from above the fine groove array panel (10). The long side widths at the slit end sections are 5 mm, the short side widths are 250 μm and the pitch between slits (center distance) is 3 mm, the slits being separated apart by 2.75 mm. The fine grooves (10-1) each have a narrow part (N) on the product liquid recovery slit (5) side nearest to the continuous phase supply slit (4). In FIG. 3-1(*b*), the dispersion phase (1) is supplied to the top slit (3) and the continuous phase (2) is supplied to the center slit (4), the dispersion phase (1) being supplied to the microflow paths (9) formed by the fine grooves (10-1), and droplets or gas bubbles being formed at the connection points (P) between the continuous phase supply slit (4) and the microflow paths (9) as well as the narrow parts (N), and the generated product being recovered through the microflow paths (9) from the slit (5) at the lower end.

FIGS. 3-2(*c*) and (*d*) show the state where a droplet or gas bubble is generated inside the device. The dispersion phase (1) is taken up into the flow of the continuous phase (2) at the connection point (P) between the continuous phase supply slit (4) and each microflow path (9), the flows of the continuous phase (2) and of the dispersion phase (1) enter into the narrow parts (N) while they are keeping continuous flows, the flows of the continuous phase (2) and dispersion phase (1) have an increased flow rate inside the narrow parts (N) where the cross-sectional area of the flow channel is narrowed, and the increased flow rate of the continuous phase (2) causes the dispersion phase (1) to be sheared at the location where the cross-sectional area of the flow channel spreads out at the outlet of the narrow parts (N), resulting in formation of smaller, more high density (greater number of) droplets or gas bubbles, compared to a case where no narrow part (N) is present, if the flow rate conditions are the same for the continuous phase (2) and dispersion phase (1). The product is recovered through the liquid recovery slit (5) from the liquid recovery port (8).

Figure 4:
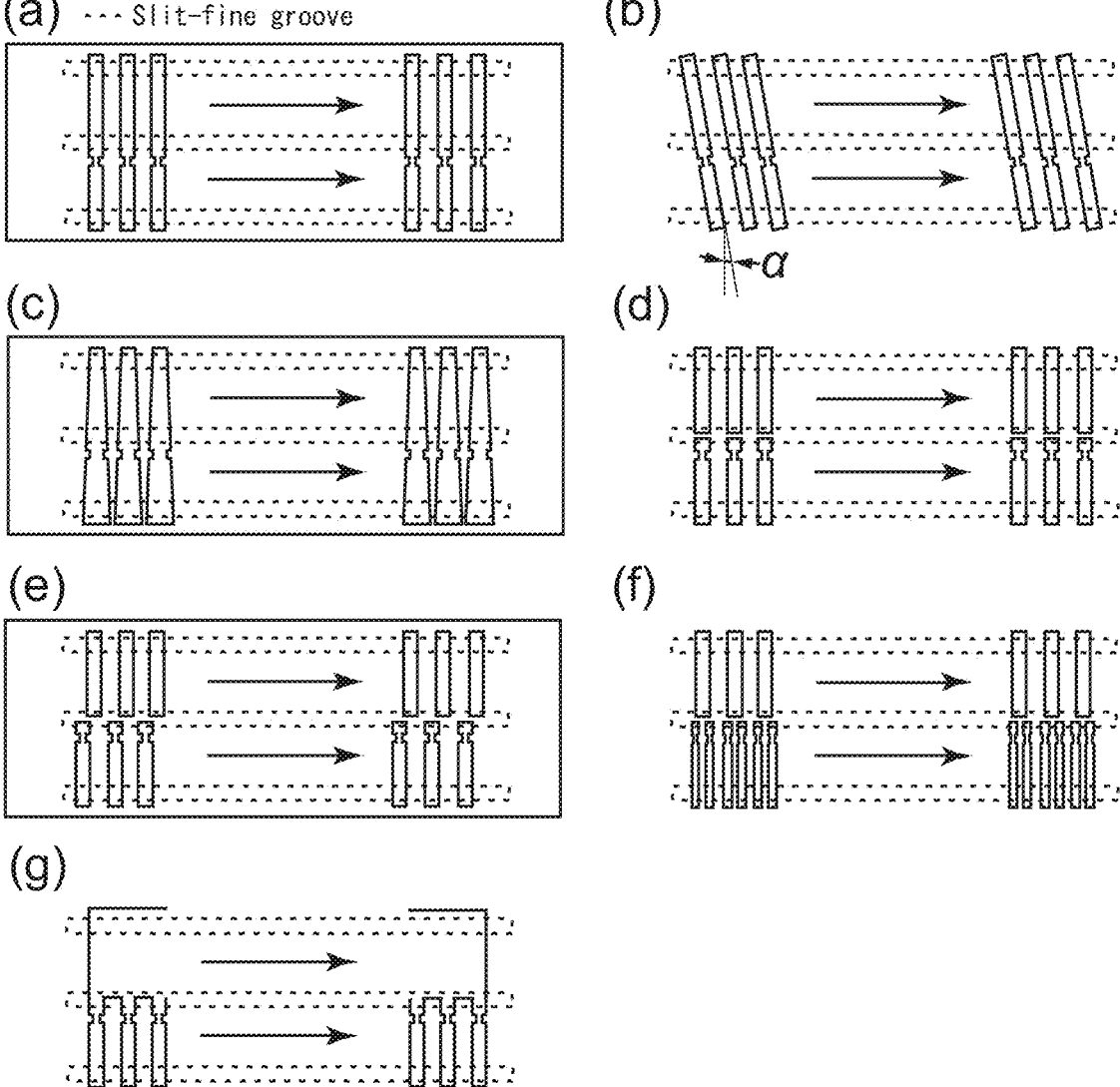
FIG. 4 is a diagram showing examples of a groove arrangements in a part with fine grooves joined to a droplet-distributing part of the invention.

FIG. 4 shows the groove shapes of the part having fine grooves (10-1) that is joined to the liquid- or gas-distributing part (20) in embodiments 1 and 2 of the invention. FIG. 4(*a*) is a case where the row of straight linear microflow paths (solid lines) is bridging three slits (dotted lines) in a perpendicular manner, FIG. 4(*b*) is a case where the row of straight linear microflow paths (solid lines) is bridging three slits (dotted lines) in a diagonal manner, and FIG. 4(*c*) is a case where the widths of the microflow paths (solid lines) bridging the three slits vary in a continuous manner. The widths of the fine grooves may also vary in a discontinuous manner. FIGS. 4(*d*) to (*f*) are cases where the microflow paths (solid lines) connecting the slits (dotted lines) are divided on both sides of a sandwiched slit (dotted line), FIG. 4(*d*) being a case where the locations and sizes match, FIG. 4(*e*) being a case where the locations are shifted and FIG. 4(*f*) being a case where the correspondence is not 1:1. FIG. 4(*g*) shows a case where rows of bridging microflow paths (solid lines) are partially joined together. The features shown in FIGS. 4(*a*) to (*g*) may also be arbitrarily combined.

For embodiments 1 and 2 of the invention, the fine groove array panel (10) can be fabricated by transfer of a pattern from a die produced using SU-8 (product of Nippon Kayaku Co., Ltd.), which is a negative-type photoresist on a Si substrate, onto a silicone resin (PDMS: polydimethylsiloxane). The liquid- or gas-distributing part (20) can be fabricated by machining a stainless steel material (SUS304), for example. The slit-shaped through pores of the liquid- or gas-distributing part (20) can be formed by wire electrical discharge machining, for example.

For embodiments 1 and 2 of the invention, W/O droplets are generated, for example, by delivering a dispersion phase of purified water and a continuous phase of a fluorine-based oil with addition of a surfactant at 1 wt %. A glass syringe and syringe pump, for example, may be used for feeding of the dispersion phase and continuous phase. For observation of droplet or gas bubble formation and measurement of the sizes of the generated droplets or gas bubbles, it is preferred to use a combination of an upright optical microscope and a high-speed video camera.

Embodiment 3

Embodiment 3 of the invention is similar to embodiment 1, but for embodiment 3 the row of the plurality of microflow paths (9) is formed on the liquid- or gas-distributing part (21) side, and the part corresponding to the fine groove array panel (10) of embodiment 1 is simply a cover (11) for closing the slits (3, 4, 5) and fine grooves (11-1) of the liquid- or gas-distributing part (21).

Figure 5:
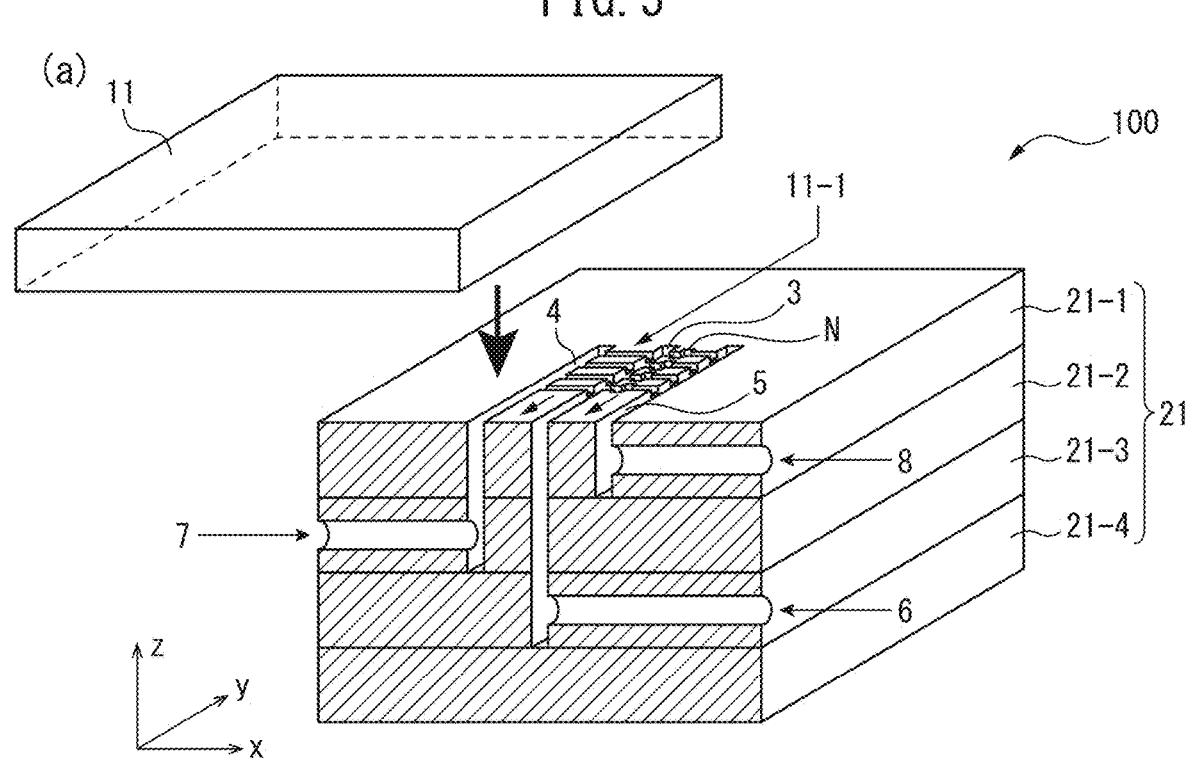
FIG. 5 shows embodiment 3 of the microdroplet/bubble-generating device (100) of the invention, where (a) is a perspective view showing the cover and the liquid-distributing part modified with the fine grooves that joins with it (partial cross-section), and (b) is a top view where the cover and the liquid-distributing part modified with the fine grooves are joined.
Figure 5:
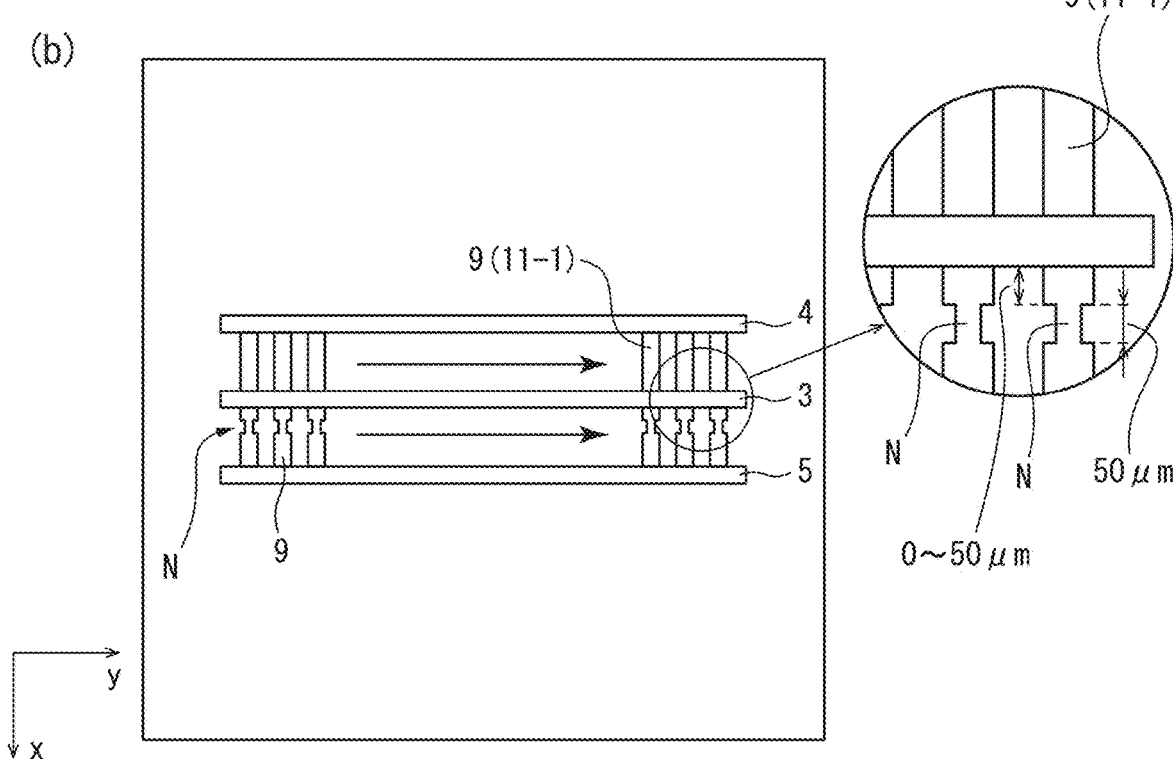

According to embodiment 3 of the invention, the liquid- or gas-distributing part (21) is constructed of four members (21-1, 21-2, 21-3, 21-4) (FIG. 5). The first member (21-1) at the uppermost section has a continuous phase supply slit (4), a dispersion phase supply slit (3), a product liquid recovery slit (5), an array of fine grooves (11-1) bridging together the respective slits, and a liquid recovery port (8) connected with the product liquid recovery slit (5). The fine grooves (11-1) each have a narrow part (N) on the product liquid recovery slit (5) side of the dispersion phase supply slit (3), at a slight spacing with the dispersion phase supply slit (3). The second member (21-2) at the second level from the top has a continuous phase supply slit (4), a dispersion phase supply slit (3) and a continuous phase supply port (7). The third member (21-3) at the third level from the top has a dispersion phase supply slit (3) and a dispersion phase supply port (6). The fourth member (21-4) at the lowermost section is a flat plate that closes the through-pore formed in the bottom of the third member (21-3) by the dispersion phase supply slit (3). FIG. 5(*a*) shows a cross-sectional perspective view where the first to fourth members of the liquid- or gas-distributing part (21) are combined. The dispersion phase (1) and continuous phase (2) that are supplied, flow from the lower layer through the slits, and are supplied to the top of the liquid- or gas-distributing part (21). That is, the continuous phase (2) is supplied from the continuous phase supply port (7) of the second member (21-2) into the continuous phase supply slit (4), and the dispersion phase (1) is supplied from the dispersion phase supply port (6) of the third member (21-3) into the dispersion phase supply slit (3), with the continuous phase (2) and dispersion phase (1) each being directed upward into the respective slits.

FIG. 5(*b*) shows the three slits, i.e. the continuous phase supply slit (4), the dispersion phase supply slit (3) and the liquid recovery slit (5) on the liquid- or gas-distributing part (21), joined with a cover (11) for sealing of the fine grooves (11-1), as seen in the plan view from above the cover (11). In FIG. 5(*b*), the continuous phase (2) is supplied to the top slit (4) and the dispersion phase (1) is supplied to the center slit (3), the continuous phase (2) being supplied to the microflow paths (9) formed by the fine grooves (11-1), and the product, generated at the connection points (P) between the dispersion phase supply slit (3) and the microflow paths (9) as well as the narrow part (N), is recovered through the microflow paths (9) from the slit (5) at the lower end. FIG. 5-2(*c*) shows the state where a droplet or gas bubble is generated inside the device. The dispersion phase (1) is taken up into the flow of the continuous phase (2) at the connection point (P) between the dispersion phase supply slit (3) and microflow path (9), the flows of the continuous phase (2) and of the dispersion phase (1) enter into the narrow part (N) while they are keeping continuous flows, the flow of the continuous phase (2) and dispersion phase (1) have an increased flow rate inside the narrow parts (N) where the cross-sectional area of the flow channel is narrowed, and the increased flow rate of the continuous phase (2) causes the dispersion phase (1) to be sheared at the location where the cross-sectional area of the flow channel spreads out at the outlet of the narrow parts (N), resulting in formation of smaller, more high density (greater number of) droplets or gas bubbles, compared to a case where no narrow part (N) is present, if the flow rate conditions are the same for the continuous phase (2) and dispersion phase (1). The product is recovered through the liquid recovery slit (5) from the liquid recovery port (8).

Embodiment 4

Embodiment 4 of the invention is similar to embodiment 3, but differs in that the configuration of each continuous phase supply slit (4) and dispersion phase supply slit (3) in the liquid- or gas-distributing part (21) is reversed. The relationship between embodiment 4 and embodiment 3 is similar to the relationship between embodiment 2 and embodiment 1, and therefore the more detailed explanation for embodiment 4 will not be repeated.

For embodiments 3 and 4 of the invention, the sealing cover (11) is preferably made of a transparent member such as a silicone resin (PDMS: polydimethylsiloxane), acrylic resin or glass. The liquid- or gas-distributing part (21) is fabricated by machining a stainless steel material (SUS304), for example. The slit-shaped through pores of the liquid- or gas-distributing part (20) can be formed by wire electrical discharge machining, for example. The fine grooves bridging together the slits can be formed by machine cutting, laser working or etching.

For embodiments 3 and 4 of the invention, W/O droplets are generated, for example, by delivering a dispersion phase of purified water and a continuous phase of a fluorine-based oil with addition of a surfactant at 1 wt %. A glass syringe and syringe pump, for example, may be used for feeding of the dispersion phase and continuous phase. For observation of droplet or gas bubble formation and measurement of the sizes of the generated droplets or gas bubbles, it is preferred to use a combination of an upright optical microscope and a high-speed video camera.

Embodiment 5

Figures 1, 6:
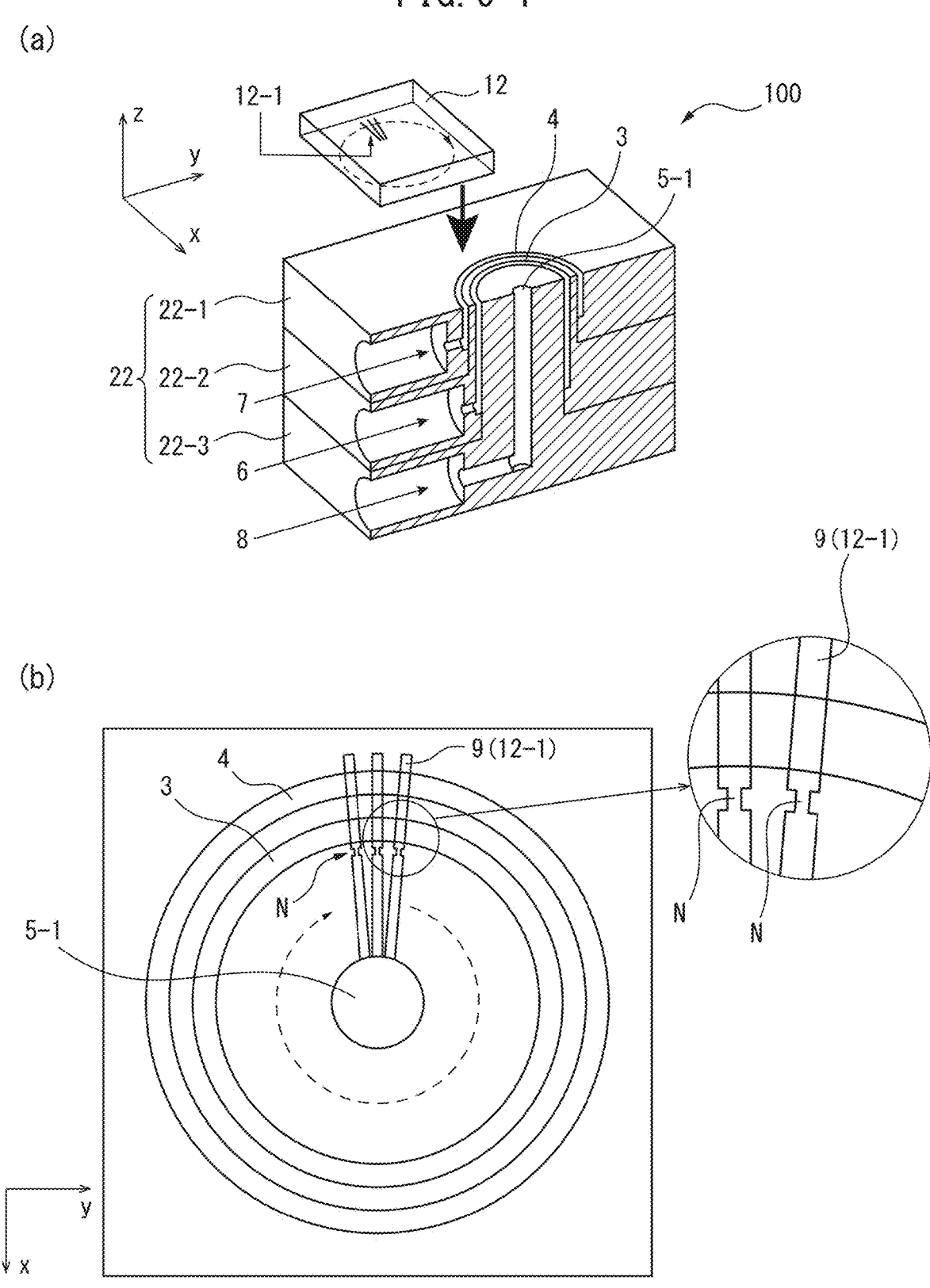
Figure 6:
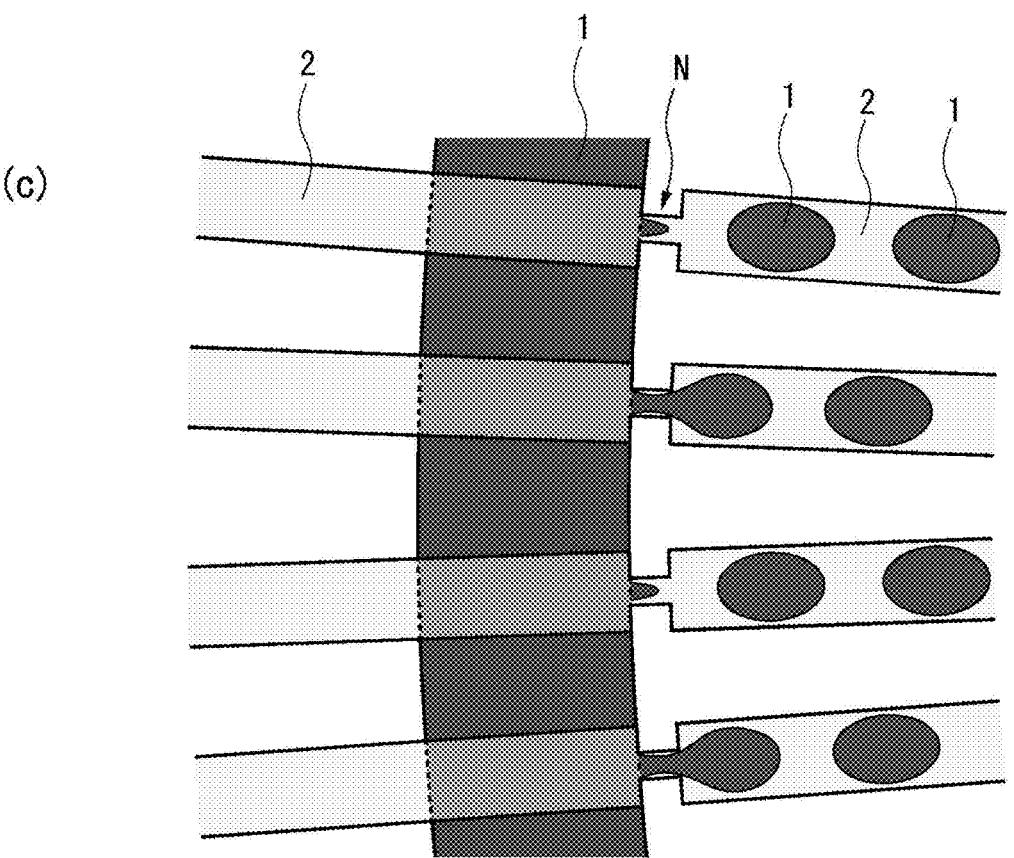
Figure 2:
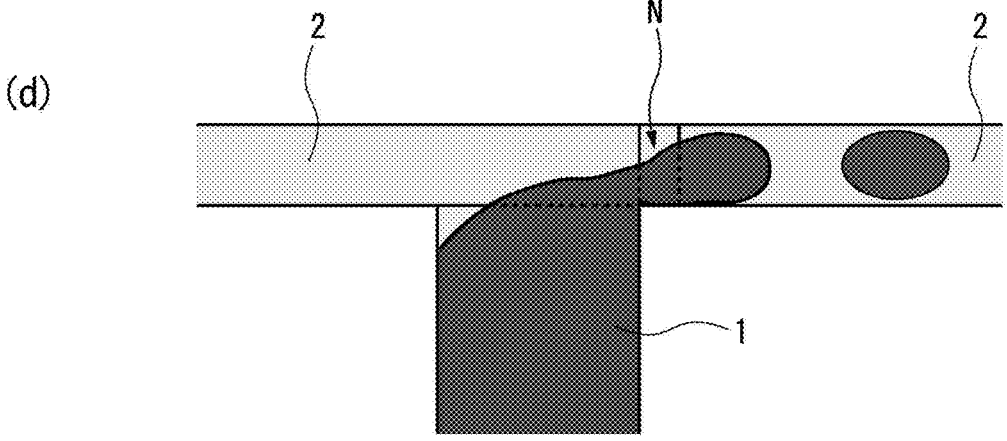

According to embodiment 5 of the invention, the liquid- or gas-distributing part (22) is constructed of three members ((22-1, 22-2, 22-3) (FIG. 6-1 and FIG. 6-2). The liquid- or gas-distributing part (22) is provided with an uppermost first member (22-1) comprising a continuous phase supply port (7), situated below the panel (12) with fine grooves (12-1), a second member (22-2) on the second level from the top that comprises a dispersion phase supply port (6) and, in combination with the first member (22-1), forms an annular slit (4) for supply of the continuous phase (2), and a third member (22-3) on the third level from the top that, in combination with the second member (22-2), forms an annular slit (3) for supply of the dispersion phase (1) and comprises a center product liquid recovery cylindrical hole (5-1) and a liquid recovery port (8) (FIG. 6-1). FIG. 6-1(*a*) shows a cross-sectional perspective view where the first to third members of the liquid- or gas-distributing part (22) are combined. The dispersion phase (1) and continuous phase (2) that are supplied, flow from the lower layer through the annular slits (3, 4), and are supplied to the top of the liquid- or gas-distributing part (22). That is, the dispersion phase (1) is supplied from the dispersion phase supply port (6) of the second member (22-2) into the dispersion phase-supply annular slit (3), and the continuous phase (2) is supplied from the continuous phase supply port (7) of the first member (22-1) into the continuous phase-supply annular slit (4), with the continuous phase (2) and dispersion phase (1) each being delivered upward into the respective slits. Here the portions other than the annular slits (3, 4) and cylindrical hole (5-1) are expressed as the dispersion phase supply port (6), continuous phase supply port (7) and liquid recovery port (8) in order to emphasize the shapes of the annular slits (3, 4) and cylindrical hole (5-1), but according to the present disclosure the annular slits (3, 4) and cylindrical hole (5-1) are functionally parts of the dispersion phase supply port (6), continuous phase supply port (7) and liquid recovery port (8) as mentioned above (the relationship between the dispersion phase supply port, continuous phase supply port and liquid recovery port in their relation to the annular slits and cylindrical hole also implicitly applies to the embodiments described below).

FIG. 6-1(*b*) shows the two slits (i.e. the continuous phase supply slit (4) and the dispersion phase supply slit (3)) and the cylindrical hole (5-1) as part of the liquid recovery port (8) on the liquid- or gas-distributing part (22), joined with the part (12) with fine grooves (12-1). The fine grooves (12-1) each have a narrow part (N) on the product liquid recovery port (8) side nearest to the dispersion phase supply slit (3). In FIG. 6-1(*b*), the continuous phase (2) is supplied to the outer annular slit (4) and the dispersion phase (1) is supplied to the inner slit (3), the continuous phase (2) being supplied to the microflow paths (9) formed by the fine grooves (12-1), and the product, generated at the connection points (P) between the dispersion phase supply slit (3) and the microflow paths (9) as well as the narrow parts (N), is recovered through the microflow paths (9) from the center liquid recovery cylindrical hole (5-1). FIG. 6-2(*c*) shows the state where a droplet or gas bubble is generated inside the device. The dispersion phase (1) is taken up into the flow of the continuous phase (2) at the connection point (P) between the dispersion phase supply slit (3) and microflow path (9), the flows of the continuous phase (2) and of the dispersion phase (1) enter into the narrow parts (N) while they are keeping continuous flows, the flows of the continuous phase (2) and dispersion phase (1) have an increased flow rate inside the narrow parts (N) where the cross-sectional area of the flow channel is narrowed, and the increased flow rate of the continuous phase (2) causes the dispersion phase (1) to be sheared at the location where the cross-sectional area of the flow channel spreads out at the outlet of the narrow part (N), resulting in formation of smaller, more high density (greater number of) droplets or gas bubbles, compared to a case where no narrow part (N) is present, if the flow rate conditions are the same for the continuous phase (2) and dispersion phase (1). The product is recovered through the liquid recovery cylindrical hole (5-1) from the liquid recovery port (8).

<div align="center">Embodiment 6</div>

Embodiment 6 of the invention is similar to embodiment 5, but the locations of the two annular slits (that is, the continuous phase supply slit (4) and dispersion phase supply slit (3)) are reversed in the liquid- or gas-distributing part (22), with the dispersion phase supply slit (3) on the outer side and the continuous phase supply slit (4) on the inner side (the drawing for embodiment 6 is the same as FIG. 6-1 and FIG. 6-2 and is therefore omitted). According to embodiment 6 of the invention, the liquid- or gas-distributing part (22) is constructed of three members. The liquid- or gas-distributing part (22) is provided with an uppermost first member (22-1) comprising a dispersion phase supply port (6), situated below the part (12) with fine grooves (12-1), a second member (22-2) on the second level from the top that comprises a continuous phase supply port (7) and, in combination with the first member (22-1), forms an annular slit (3) for supply of the dispersion phase (1), and a third member (22-3) on the third level from the top that, in combination with the second member (22-2), forms an annular slit (4) for supply of the continuous phase (2) and comprises a center product liquid recovery cylindrical hole (5-1) and a liquid recovery port (8). The supplied dispersion phase (1) and continuous phase (2) are flow from the lower layer through the annular slits (3, 4), and are supplied to the top of the liquid- or gas-distributing part (22). That is, the dispersion phase (1) is supplied from the dispersion phase supply port (6) of the first member (22-1) into the dispersion phase-supply annular slit (3), and the continuous phase (2) is supplied from the continuous phase supply port (7) of the second member into the continuous phase-supply annular slit (4), with the continuous phase (2) and dispersion phase (1) each being delivered upward into the respective slits.

In the microdroplet/bubble-generating device (100) where the two slits on the liquid- or gas-distributing part (22) (the continuous phase supply slit (4) and dispersion phase supply slit (3)) and the cylindrical hole (5-1), join with the part (12) with fine grooves (12-1), the dispersion phase (1) is supplied to the outer annular slit (3) and the continuous phase (2) is supplied to the inner slit (4), the dispersion phase (1) being supplied to the microflow paths (9) formed by the fine grooves (12-1), and the product, generated at the connection points (P) between the continuous phase supply slit (4) and the microflow paths (9) as well as the narrow parts (N), is recovered through the microflow paths (9) from the center liquid recovery cylindrical hole (5-1).

The dispersion phase (1) is taken up into the flow of the continuous phase (2) at each the connection point (P) between the continuous phase supply slit (4) and each microflow path (9), the flows of the continuous phase (2) and of the dispersion phase (1) enter into each the narrow part (N) while they are keeping continuous flows, the flows of the continuous phase (2) and dispersion phase (1) have an increased flow rate inside the narrow part (N) where the cross-sectional area of the flow channel is narrowed, and the increased flow rate of the continuous phase (2) causes the dispersion phase (1) to be sheared at the location where the cross-sectional area of the flow channel spreads out at the outlet of the narrow part (N), resulting in formation of smaller, more high density (greater number of) droplets or gas bubbles, compared to a case where no narrow part (N) is present, if the flow rate conditions are the same for the continuous phase (2) and dispersion phase (1). The product is recovered through the liquid recovery cylindrical hole (5-1) from the liquid recovery port (8).

<div align="center">Embodiment 7</div>

According to embodiment 7 of the invention, the liquid- or gas-distributing part (23) is constructed of three members (23-1, 23-2, 23-3) (FIG. 7). The liquid- or gas-distributing part (23) is set on the bottom part of the flat cover (13) serving to close the slits (3, 4), the cylindrical hole (5-1) and the fine grooves (13-1) with narrow parts (N). It is provided with an uppermost first member (23-1) comprising a continuous phase supply port (7), a second member (23-2) on the second level from the top that comprises a dispersion phase supply port (6) and, in combination with the first member (23-1), forms an annular slit (4) for supply of the continuous phase (2), and a third member (23-3) on the third level from the top that, in combination with the second member (23-2), forms an annular slit (3) for supply of the dispersion phase (1) and comprises a center product liquid recovery cylindrical hole (5-1). Fine grooves (13-1) are formed between the annular slits (4, 3) and between the annular slit (5) and cylindrical hole (5-1), formed by combination of the three members (23-3). The fine grooves (13-1) each have a narrow part (N) nearest the product liquid recovery port (8) side of the annular slit (3) for supply of the dispersion phase.

A cross-sectional perspective view of a liquid- or gas-distributing part (23) in which the first to third members (23-1, 23-2, 23-3) are combined is shown at the bottom of FIG. 7(a). The dispersion phase (1) and continuous phase (2) that are supplied, flow from the lower layer through the annular slits (3, 4), and are supplied to the top of the liquid- or gas-distributing part (22). That is, the dispersion phase (1) is supplied from the dispersion phase supply port (6) of the second member (23-2) into the dispersion phase-supply annular slit (3), and the continuous phase (2) is supplied from the continuous phase supply port (7) of the first member (23-1) into the continuous phase-supply annular slit (4), with the continuous phase (2) and dispersion phase (1) each being delivered upward into the respective slits (3, 4).

FIG. 7(b) shows the two slits (i.e. the continuous phase supply slit (4) and the dispersion phase supply slit (3)), the liquid recovery cylindrical hole (5-1) and the fine grooves (13-1) on the liquid- or gas-distributing part (23), joined with the sealing flat plate cover (13). In FIG. 7(b), the continuous phase (2) is supplied to the outer annular slit (4) and the dispersion phase (1) is supplied to the inner slit (3), the continuous phase (2) being supplied to the microflow paths (9) formed by the fine grooves (13-1), and the product generated, at the connection points (P) between the dispersion phase supply slit (3) and the microflow paths (9) as well as the narrow parts (N), is collected through the microflow paths (9) from the center liquid recovery cylindrical hole (5-1). The state where droplets or gas bubbles are generated inside the device is the same as illustrated in FIGS. 2-3(e) and (f). The dispersion phase (1) is taken up into the flow of the continuous phase (2) at the connection point (P) between the dispersion phase supply slit (3) and microflow paths (9), the flows of the continuous phase (2) and of the dispersion phase (1) enter into the narrow part (N) while they are keeping continuous flows, the flows of the continuous phase (2) and dispersion phase (1) have an increased flow rate inside the narrow part (N) where the cross-sectional area of the flow channel is narrowed, and the increased flow rate of the continuous phase (2) causes the dispersion phase (1) to be sheared at the location where the cross-sectional area of the flow channel spreads out at the outlet of the narrow part (N), resulting in formation of smaller, more high density (greater number of) droplets or gas bubbles, compared to a case where no narrow part (N) is present, if the flow rate conditions are the same for the continuous phase (2) and dispersion phase (1). The product is recovered through the liquid recovery cylindrical hole (5-1) from the liquid recovery port (8).

Embodiment 8

Embodiment 8 of the invention is similar to embodiment 7, but differs in that the configuration of each continuous phase supply slit (4) and dispersion phase supply slit (3) in the liquid- or gas-distributing part (23) is reversed. The relationship between embodiment 8 and embodiment 7 is similar to the relationship between embodiment 6 and embodiment 5, and therefore the more detailed explanation for embodiment 8 will not be repeated.

For embodiment 9 of the invention, the liquid- or gas-distributing part (200) may be constructed using four members, so that the center cylindrical hole of the device of embodiments 5 and 6 is changed to the annular slit, and a part with fine grooves (fine groove array panel) may be attached to allow generation of droplets or gas bubbles in the same manner.

For embodiment 10 of the invention, the liquid- or gas-distributing part (200) may be constructed using four members, so that the center cylindrical hole of the device used for embodiments 7 and 8 is changed to the annular slit, and a sealing panel may be attached to allow generation of droplets or gas bubbles in the same manner.

EXAMPLES

The invention will now be explained in greater detail by the following examples.

Example 1

A droplet-generating device (FIG. 2-1 to FIG. 2-3) constructed of a paralleled straight linear microflow path panel having a rectangular cross-sectional shape (fine groove array panel) and a liquid-distributing part was designed and fabricated. The microflow path panel comprised 16 linear microflow paths with rectangular cross-sections (100 μm width, 100 μm height) and 10 mm-long shapes, the gap between the flow paths being 100 μm, and each of the linear microflow paths being provided with a narrow part having a rectangular cross-section (50 μm width, 100 μm height) and a 50 μm-long shape, at a location with a distance in a range of 125 to 175 μm on one end side from the center in the lengthwise direction of the fine groove array panel (FIG. 2-1(a)). The liquid-distributing part was constructed of a stack of four members each with a width of 30 mm, a length of 30 mm and a height of 8 mm (FIG. 2-2(b)). The uppermost section member had a total of 3 slits: a continuous phase supply slit, a dispersion phase supply slit and a product liquid recovery (liquid recovery) slit, and a liquid recovery port on the side of the member connected with the product liquid recovery (discharge) slit. Each slit had a width of 250 μm and a length of 5 mm, and the pitch between the slits was 3 mm (FIG. 2-2(c)). The member on the second level from the top had a continuous phase supply slit, a dispersion phase supply slit and a continuous phase supply port on the side of the member connected with the continuous phase supply slit, and also served to seal the liquid recovery slit of the member directly above it. The third member on the third level from the top had a dispersion phase supply slit and a dispersion phase supply port on the side of the member connected with the dispersion phase supply slit, and also served to seal the continuous phase supply slit of the member directly above it. The lowermost member sealed the dispersion phase supply slit of the member directly above it. FIG. 2-2(c) shows a cross-sectional view where the four members of the liquid-distributing part are combined. The supplied dispersion phase and continuous phase flow from the lower layer through the slit flow channels and are supplied to the top of the distributing part.

FIG. 2-2(d) shows a conceptual view from above the device, where the microflow path panel is positioned and joined onto the 3 slits of a liquid-distributing part. The dispersion phase is supplied to the center slit flow channel while the continuous phase is supplied to the upper slit flow channel, and the product is recovered at the lower slit flow channel. The narrow parts are formed at spacings of 0 to 50 μm on the liquid recovering slit side from the dispersion phase supply slit flow channels. FIGS. 2-3(e) and (f) are conceptual drawings showing the state where droplets are generated in microflow paths with narrow parts.

The microflow path panel was fabricated by transfer of a pattern from a die with a height of 100 μm, produced using SU-8 (Nippon Kayaku Co., Ltd.) which is a negative-type photoresist on a Si substrate, onto polydimethylsiloxane (PDMS). Silpot184 (Dow Corning Toray) was used as the PDMS starting material. The four members of the liquid-distributing part were fabricated by machining a stainless steel material (SUS304). The slit-shaped through pores of the liquid-distributing part (20) were formed by wire electrical discharge machining. In order to prevent fluid leakage from the bonding surfaces between the members of the liquid-distributing part during supply of the continuous phase and dispersion phase to the flow channel distributing part, PDMS was coated onto the bonding surfaces and heated at 120° C. to hardening.

The introduced samples used were corn oil (Wako Pure Chemical Industries, Ltd.) containing a surfactant (SY-Glyster CRS-75 by Sakamoto Yakuhin Kogyo Co., Ltd., 1 wt %) as the continuous phase, and purified water as the dispersion phase. A 10 ml glass syringe (1000 series, Hamilton Company, USA) and a syringe pump (KDS200, KD Scientific, USA) were used for delivery into the liquid-distributing part. An upright microscope (BX-51, Olympus Corp.) and a high-speed video camera (Fastcam-1024PCI, Photron) were used in combination for observation of the state of droplet generation in the microflow paths.

FIG. 8(a) shows the state of W/O droplet generation in a paralleled microflow path, with the continuous phase flow rate ($Q_c$) set to 20 mL/h and the dispersion phase flow rate ($Q_d$) set to 10 mL/h. Generation of W/O droplets was observed at the locations where the microflow paths and dispersion phase supply slit were connected. The number of droplets generated per second per microflow path near the slit centers was approximately 370. The mean diameter of the generated droplets was 96 μm and the coefficient of variation (CV) was 6.3% (FIG. 8(*b*)).

Example 2

The same test apparatus as in Example 1 was used for a test under the same conditions as in Example 1, except that the continuous phase flow rate was 10 mL/h. FIG. 9 shows the state of W/O droplet generation at the center sections of the slits and the generated droplet size distribution. The number of droplets generated per second per microflow path near the slit centers was approximately 250. The mean diameter of the obtained droplets was 110 μm, and the coefficient of variation was 2.6%.

Comparative Example 1

A test was conducted under the same conditions as Example 1 using the same test apparatus as Example 1, except for using a gas distributing part which had microflow paths without a narrow part. FIG. 10 shows the state of W/O droplet generation at the center sections of the slits and the generated droplet size distribution. The number of droplets generated per second per microflow path near the slit centers was approximately 220. The mean diameter of the obtained droplets was 115 μm, and the coefficient of variation was 4.2%.

When FIG. 8 (Example 1) and FIG. 10 (Comparative Example 1) are compared, it is seen that for the same continuous phase flow rate and dispersion phase flow rate, having narrow parts results in a smaller mean diameter for generated droplets and higher density (number), compared to a lack of narrow parts.

When FIG. 9 (Example 2) and FIG. 10 (Comparative Example 1) are compared, it is seen that with the narrow parts of Example 2, it was possible to reduce the continuous phase flow rate necessary for the same mean diameter of droplets generated with the same dispersion phase flow rate, as compared with a lack of narrow parts as in Comparative Example 1.

INDUSTRIAL APPLICABILITY

According to the invention there is provided a microdroplet/bubble-generating device (100) wherein liquid distributing flow channels and droplet-forming flow channels are connected and droplets and gas bubbles of smaller sizes can be formed and microdroplets or gas bubbles can be formed with lower pressure loss and lower risk of clogging, without requiring separate through-holes corresponding to the droplet-forming flow channels, and it can be applied to a variety of fields including fields of chemical and biochemical analysis.

REFERENCE SIGNS LIST

1 Dispersion phase
2 Continuous phase
3 Dispersion phase supply slit
4 Continuous phase supply slit
5 (Microdroplet/gas bubble) liquid recovery slit
5-1 gasCylindrical hole portion of (Microdroplet/gas bubble) liquid recovery port
6 Dispersion phase supply port
7 Continuous phase supply port
8 (Microdroplet/gas bubble) Liquid recovery port
9 Microflow path

S Reference plane
N Narrow part
P Connection point between microflow path and slit
100 Microdroplet/bubble-generating device
10 Fine groove array panel (microflow channel array)
10-1 Fine groove
11 Sealing cover
11-1 Fine groove
12 Panel with fine grooves
12-1 Fine groove
13 Sealing cover
13-1 Fine groove
15-3 Annular slit
20 Liquid- or gas-distributing part
20-1 Component member of liquid- or gas-distributing part (first member)
20-2 Component member of liquid- or gas-distributing part (second member)
20-3 Component member of liquid- or gas-distributing part (third member)
20-4 Component member of liquid- or gas-distributing part (fourth member)
21 Liquid- or gas-distributing part
21-1 Component member of liquid- or gas-distributing part (first member)
21-2 Component member of liquid- or gas-distributing part (second member)
21-3 Component member of liquid- or gas-distributing part (third member)
22 Liquid- or gas-distributing part
22-1 Component member of liquid- or gas-distributing part (first member)
22-2 Component member of liquid- or gas-distributing part (second member)
22-3 Component member of liquid- or gas-distributing part (third member)
23 Liquid- or gas-distributing part
23-1 Component member of liquid- or gas-distributing part (first member)
23-2 Component member of liquid- or gas-distributing part (second member)
23-3 Component member of liquid- or gas-distributing part (third member)

The invention claimed is:
1. A microdroplet/bubble-generating device, comprising:
a row of a plurality of microflow paths,
a dispersion phase supply port, a continuous phase supply port and a liquid recovery port, and
a first slit, wherein:
the plurality of microflow paths are connected with an end of the first slit in a reference plane,
the plurality of microflow paths each have a first side microflow path and a second side microflow path on either side of a connection point between each of the plurality of microflow paths and the first slit,
the first side microflow paths are connected with one of the continuous phase supply port and the dispersion phase supply port, the first slit being connected with the other one of the continuous phase supply port and the dispersion phase supply port,
the second side microflow paths are connected with a liquid recovery port,
the plurality of microflow paths each have a narrow part in the second side microflow path where the cross-sectional area of the flow path is locally narrowed, either in contact with or near each connection point between each of the plurality of microflow paths and the first slit, and the cross-sectional area of the narrow part is in the range of 1/100 to 1/1.5 of the area of the cross-section of the second side microflow path.

2. The microdroplet/bubble-generating device according to claim 1, wherein the length of the narrow part in the flow path direction is in the range of 0.01 to 10 times the square root of the area of the cross-section of the second side microflow path.

3. The microdroplet/bubble-generating device according to claim 1, wherein the distance from the connection point between each of the plurality of microflow paths and the first slit to the narrow parts is in a range of no greater than 5 times the square root of the area of the cross-section of the second side microflow paths to zero.

4. The microdroplet/bubble-generating device according to claim 1, wherein the length of the narrow part in the flow path direction is in the range of 0.1 to 1000 μm.

5. The microdroplet/bubble-generating device according to claim 1, wherein the distance from the connection point between each of the plurality of microflow paths and the first slit to the narrow part is in a range of 1000 μm to zero.

6. The microdroplet/bubble-generating device according to claim 1, wherein at least one of the following a) and b) is satisfied:

a) the continuous phase supply port or dispersion phase supply port connected with the first side microflow path comprises a second slit, an end of the second slit being connected with the plurality of microflow paths, and b) the liquid recovery port comprises a third slit, an end of the third slit being connected with the plurality of microflow paths.

7. The microdroplet/bubble-generating device according to claim 1, wherein the liquid recovery port comprises a cylindrical hole, and the second side microflow paths of the plurality of microflow paths are connected with the cylindrical hole.

8. The microdroplet/bubble-generating device according to claim 1, wherein the inner walls of the plurality of microflow paths are composed of hydrophobic surfaces, the dispersion phase is an aqueous phase, and the continuous phase is an organic phase.

9. The microdroplet/bubble-generating device according to claim 1, wherein the inner walls of the plurality of microflow paths are composed of hydrophilic surfaces, the dispersion phase is an organic phase, and the continuous phase is an aqueous phase.

10. A microdroplet/bubble-generating method, the method using a microdroplet/bubble-generating device, comprising a row of a plurality of microflow paths, a dispersion phase supply port, a continuous phase supply port and a liquid recovery port, and a first slit, wherein:

the plurality of microflow paths are connected with an end of the first slit in a reference plane, the plurality of microflow paths each have a first side microflow path and a second side microflow path on either side of a connection point between each of the plurality of microflow paths and the first slit, the first slit is connected with one of the continuous phase supply port and the dispersion phase supply port, the other one of the continuous phase supply port and the dispersion phase supply port being connected with the first side microflow paths, and the second side microflow paths are connected with the liquid recovery port, the method being characterized in that the plurality of microflow paths each have a narrow part in the second side microflow path where the cross-sectional area of the flow path is locally narrowed, either in contact with or near each connection point between each of the plurality of microflow paths and the first slit, the cross-sectional area of the narrow part is in the range of 1/100 to 1/1.5 of the area of the cross-section of the second side microflow path, a continuous phase and a dispersion phase that have met at each connection point between each of the plurality of microflow paths and first slit flow into each narrow part, the dispersion phase being sheared at the narrow part with a flow of the continuous phase as the driving force, forming droplets or bubbles of the dispersion phase, and the product being collected through the liquid recovery port.

11. The microdroplet/bubble-generating method according to claim 10, wherein the length of the narrow part in the flow path direction is in the range of 0.01 to 10 times the square root of the area of the cross-section of the second side microflow path.

12. The microdroplet/bubble-generating method according to claim 10, wherein the distance from the connection point between each of the plurality of microflow paths and the first slit to the narrow part is in a range of no greater than 5 times the square root of the area of the cross-section of the second side microflow path to zero.

13. The microdroplet/bubble-generating method according to claim 10, wherein the length of the narrow part in the flow path direction is in the range of 0.1 to 1000 μm.

14. The microdroplet/bubble-generating method according to claim 10, wherein the distance from the connection point between each of the plurality of microflow paths and the first slit to the narrow part is in a range of 1000 μm to zero.

15. The microdroplet/bubble-generating method according to claim 10, wherein at least one of the following c) and d) is satisfied:

c) the continuous phase supply port or dispersion phase supply port connected with the first side microflow paths comprises a second slit, an end of the second slit being connected with the plurality of microflow paths, one of the continuous phase and dispersion phase being supplied to the first side microflow paths through the second slit, the other one of the continuous phase and dispersion phase being supplied to the plurality of microflow paths through the first slit, and d) the liquid recovery port comprises a third slit, an end of the third slit being connected with the plurality of microflow paths, the microdroplet or bubble being recovered from the third slit through the second side microflow paths.

16. The microdroplet/bubble-generating method according to claim 10, wherein the liquid recovery port comprises a cylindrical hole, and the second side microflow paths of the plurality of microflow paths are connected with the cylindrical hole.

17. The microdroplet/bubble-generating method according to claim 10, wherein the inner walls of the plurality of microflow paths are composed of hydrophobic surfaces, the dispersion phase is an aqueous phase, and the continuous phase is an organic phase.

18. The microdroplet/bubble-generating method according to claim 10, wherein the inner walls of the plurality of microflow paths are composed of hydrophilic surfaces, the dispersion phase is an organic phase, and the continuous phase is an aqueous phase.

* * * * *